United States Patent [19]
Kikuda et al.

[11] Patent Number: 5,519,243
[45] Date of Patent: May 21, 1996

[54] SEMICONDUCTOR DEVICE AND MANUFACTURING METHOD THEREOF

[75] Inventors: Shigeru Kikuda; Kiyohiro Furutani; Makoto Suwa, all of Hyogo, Japan

[73] Assignee: Mitsubishi Denki Kabushiki Kaisha, Tokyo, Japan

[21] Appl. No.: 305,524

[22] Filed: Sep. 13, 1994

[30] Foreign Application Priority Data

Sep. 14, 1993 [JP] Japan .................................. 5-228985

[51] Int. Cl.⁶ ........................ H01L 29/76; H01L 21/265
[52] U.S. Cl. ..................... 287/371; 257/296; 257/298; 257/313; 257/378; 257/532; 257/579; 257/657; 437/40; 437/48; 437/913; 437/919
[58] Field of Search ................................... 257/296, 371, 257/378, 652, 653, 579, 313, 298, 532, 657; 437/40, 48, 913, 919

[56] References Cited

U.S. PATENT DOCUMENTS 4,890,149 12/1989 Bertotti et al. ........................ 257/653
4,994,880 2/1991 Kato et al. ............................. 257/579
5,136,348 8/1992 Tsuzuki et al. ....................... 257/653
5,281,842 1/1994 Yasuda et al. ........................ 257/371
5,304,830 4/1994 Sato ...................................... 257/371
5,373,476 12/1994 Jeon ..................................... 257/371

OTHER PUBLICATIONS

"A Review on Critical Technology for a Manufacturable 64Mb DRAM", by Oh–Hyun Kwon et al, SDM90–201, pp. 41–46.

"A 45ns 16Mb DRAM with Triple–Well Structure", by Syuso Fujii et al, 1989 IEEE International Solid–State Circuits Conference, pp. 248–249.

Primary Examiner—Edward Wojciechowicz
Attorney, Agent, or Firm—Lowe, Price, Leblanc & Becker

[57] ABSTRACT

A semiconductor device according to the present invention includes on the main surface of a p substrate a storing circuit region and peripheral circuit regions. An n well surrounds a p well including the storing circuit region and a p well including the peripheral circuit regions. As a result, a capacitance element is formed in the semiconductor substrate. It is possible to miniaturize the semiconductor device, and to improve reliability of connection between elements.

44 Claims, 28 Drawing Sheets

SEMICONDUCTOR DEVICE AND MANUFACTURING METHOD THEREOF

BACKGROUND OF THE INVENTION

1. Field of the Invention

The present invention generally relates to a semiconductor device and a method of manufacturing the same, and more particularly, to a semiconductor device which can implement formation of a capacitance element therein and miniaturization thereof, and a method of manufacturing the same.

2. Description of the Background Art

Conventionally, when a capacitance element is formed in an integrated circuit of a semiconductor device, a capacitance element formed of opposing interconnection layers serving as electrodes, and an MOS capacitor formed between the source/drain region and the gate of an MOS transistor are used.

There are capacitance elements ranging from a small one used for delaying a signal in an integrated circuit to a large one used as a decoupling capacitor which prevents generation of noise when the power supply voltage externally supplied at the time of operation of the integrated circuit is internally changed.

Referring to FIG. 31, description will be given of a configuration concept of a semiconductor memory device.

In the figure, a semiconductor substrate is divided into a memory cell array region 200, a peripheral circuit region 202, and an interconnection region 204.

A power supply decoupling capacitor requiring a large capacitance is conventionally formed under interconnection region 204 with an MOS capacitor.

This is because the large thickness of an insulating layer between interconnection layers causes a small capacitance per unit area in the case of a capacitance element formed of opposing interconnection layers. In addition, the interconnection layers used as a capacitance element cannot be used as a signal interconnection.

On the other hand, when a capacitance element is formed using an MOS capacitor, a capacitance is formed between the gate electrode opposing to a gate oxide film of an MOS transistor and a channel of the MOS transistor in an on state. Therefore, a relatively large capacitance per unit area can be obtained.

Referring to FIG. 32, description will be given of a configuration of a power supply decoupling capacitor formed using an MOS capacitor.

In the figure, an example of a power supply decoupling capacitor using an n channel MOS transistor is shown on the left, and an example of a power supply decoupling capacitor using a p channel MOS transistor is shown on the right.

The power supply decoupling capacitor using an n channel MOS transistor on the left includes a p well 208 formed on a p substrate 206. An n channel MOS transistor 210 is formed on the surface of p well 208. The source/drain region of n channel MOS transistor 210 is supplied with the ground potential ($V_{SS}$).

The gate electrode of n channel MOS transistor 210 is supplied with the external power supply potential ($V_{CC}$). p well 208 is supplied with an internally generated negative potential ($V_{BB}$) through a $p^+$ impurity region 212.

The power supply decoupling capacitor using a p channel MOS transistor includes an n well 207 formed on p substrate 206. A p channel MOS transistor 214 is formed on the surface of n well 207.

The source region and the drain region of p channel MOS transistor 214 are supplied with the external power supply potential ($V_{CC}$). The gate electrode of p channel MOS transistor 214 is supplied with the ground potential ($V_{SS}$). n well 207 is supplied with the external power supply potential ($V_{CC}$) through an $n^+$ impurity region 216.

In the power supply decoupling capacitor, the voltage applied to the source/drain region of the MOS transistor turns on the channel region of the MOS transistor, thereby forming a capacitor between the channel region and the gate electrode.

Although an MOS capacitor is generally used as a power supply decoupling capacitor, it can also be used for delaying a signal in a peripheral circuit. In this case, a signal node which is to be delayed has only to be connected to the gate electrode of the MOS capacitor.

Referring to FIG. 33, description will be given of a configuration of a dynamic type random access memory. FIG. 33 is a sectional concept diagram of a dynamic type random access memory (hereinafter referred to as a "DRAM") disclosed in a brochure of a seminar (SDM90-201-p43, 1990) of Institute of Electronics, Information and Communication Engineers of Japan.

The DRAM includes on p substrate 206 a peripheral circuit region 1000 including a p well 218 on which an n channel MOS transistor 226 is formed, a peripheral circuit region 2000 including an n well 220 on which a sense amplifier, for example, is formed by a p channel MOS transistor 228 or the like, and a storing circuit region 3000 including a p well 222 on which a memory cell or the like is formed by an n channel MOS transistor 232 or the like.

In peripheral circuit region 1000, the ground potential ($V_{SS}$) is applied to p well 218 through a $p^+$ impurity region 224.

In peripheral circuit region 2000, the external power supply potential ($V_{CC}$) is applied to n well 220 through an $n^+$ impurity region 230.

In storing circuit region 3000, the internally generated negative potential ($V_{BB}$) is applied to p well 222 through a $p^+$ impurity region 234.

n well 220 is formed so as to surround p well 222 for isolating p substrate 206 supplied with the same potential ($V_{SS}$) as that of p well 218 and p well 222 supplied with the $V_{BB}$ potential.

The configuration in which n well 220 is formed under p well 222 as described above is generally called as a triple well configuration.

When a power supply decoupling capacitor is formed in such a DRAM having a triple well configuration, n channel MOS transistor 210 is provided beside $p^+$ impurity region 224 in p well 218, for example, as shown in FIG. 34.

FIG. 35 is a sectional concept diagram of a DRAM disclosed in Proceedings (p249) of International Solid-State Circuits Conference held in 1989.

The DRAM in this figure includes on n substrate 206 a peripheral circuit region 4000 including an n well 236 on which a voltage dropping circuit, for example, is formed by a p channel MOS transistor 244 or the like, a peripheral circuit region 5000 including a p well region 238 on which an input protecting circuit, for example, is formed by an n channel MOS transistor 250 or the like, a peripheral circuit region 6000 including an n well 240 on which a sense amplifier, for example, is formed by a p channel MOS transistor 252 or the like, and a storing circuit region 7000 including a p well 242 on which a memory cell, for example, is formed by an n channel MOS transistor 260 or the like.

In peripheral circuit region 4000, the external power supply potential ($V_{CC}$) is applied to n well 236 through an $n^+$ impurity region 246.

In peripheral circuit region 5000, the ground potential ($V_{SS}$) is applied to p well 238 through $p^+$ impurity regions 248, 256.

In peripheral circuit region 6000, the internal power supply potential ($V_{INT}$) is applied to n well 240 through an $n^+$ impurity region 254.

In storing circuit region 7000, the internally generated negative potential ($V_{BB}$) iS applied to p well 242 through a $p^+$ impurity region 258.

The DRAM shown in this figure also has a triple well configuration in which p well 238 is formed so as to surround n well 240 for isolating n substrate 206 supplied with the same potential ($V_{CC}$) as that of n well 236 and n well 240 supplied with the internal power supply potential ($V_{INT}$).

As described above, the conventional triple well configuration is used for isolating wells of the same conductivity type having different potentials.

When a power supply decoupling capacitor is formed in the DRAM shown in FIG. 35, a p channel MOS transistor 214 is provided in a region of n well 236, for example, as shown in FIG. 36.

However, in the above conventional technique, when a decoupling capacitor is formed in the conventional DRAM configuration, the MOS transistor must be formed on the surface of the well region as shown in FIGS. 34 and 36.

As a result, the area of the semiconductor device is increased, preventing miniaturization of the semiconductor device.

When the decoupling capacitor is insufficiently connected to an element, noise cannot be eliminated, resulting in malfunction of the semiconductor device.

SUMMARY OF THE INVENTION

An object of the present invention is to provide a semiconductor device which can implement miniaturization by forming a capacitance element in a semiconductor substrate and improvement of reliability of connection between elements, and a method of manufacturing the same.

In order to achieve the above objects, the semiconductor device according to one aspect of the present invention includes a semiconductor substrate of a first conductivity type, a first impurity region of a second conductivity type formed to have a predetermined depth from the main surface of the semiconductor substrate and having a first circuit region, a second impurity region of the first conductivity type formed in the first impurity region to have a predetermined depth from the main surface of the semiconductor substrate and having a second circuit region, and a third impurity region of the second conductivity type formed in the first impurity region to have a predetermined depth from the main surface of the semiconductor substrate and having a third circuit region. The semiconductor substrate and the third impurity region are set to the same potential, the first impurity region is set to a potential different from that of the semiconductor substrate and the third impurity region, and the second impurity region is set to a potential different from that of said first impurity region.

Preferably, the semiconductor substrate and the third impurity region are set to a first potential of p type, the first impurity region is set to a second potential of n type higher than the first potential, and the second impurity region is set to the internally generated negative potential.

More preferably, the semiconductor substrate and the third impurity region are set to a first potential of n type, the first impurity region is set to a second potential of p type lower than the first potential, and the second impurity region is set to a third potential of n type higher than said second potential.

More preferably, the first circuit region and the third circuit region form a peripheral circuit, and the second circuit region form a storing circuit region.

According to the semiconductor device, a junction capacitance is increased as an increase in an area of the interface between the first impurity region and the third impurity region and an area of the interface between the first impurity region and the semiconductor substrate. As a result, a decoupling capacitor can be formed without increasing an element forming region.

The semiconductor device according to another aspect of the present invention includes a semiconductor substrate of a first conductivity type, a first impurity region of a second conductivity type formed to have a predetermined depth from the main surface of the semiconductor substrate and having a first circuit region, a second impurity region of the first conductivity type formed in the first impurity region to have a predetermined depth from the main surface of the semiconductor substrate and having a second circuit region, a third impurity region of the first conductivity type formed to have a predetermined depth from the main surface of the semiconductor substrate with its one side surface and a part of its bottom surface within the first impurity region, and having a third circuit region, and a fourth impurity region of the second conductivity type formed to have a predetermined depth from the main surface of the semiconductor substrate so as to surround the other side surface and a part of the bottom surface of the third impurity region. The semiconductor substrate and the third impurity region are set to the same potential, the first impurity region and the fourth impurity region are set to different potentials, and the second impurity region and the third impurity region are set to different potentials.

Preferably, the semiconductor substrate and the third impurity region are set to a first potential of p type, the first impurity region is set to a second potential of n type higher than the first potential, the second impurity region is set to a third potential of p type lower than the second potential, and the fourth impurity region is set to a fourth potential of n type higher than the first potential.

More preferably, the semiconductor substrate and the third impurity region are set to a first potential of n type, the first impurity region is set to a second potential of p type lower than the first potential, the second impurity region is set to a third potential of n type higher than the second potential, and the fourth impurity region is set to a fourth potential of p type lower than the first potential.

More preferably, the first circuit region and the third circuit region form a peripheral circuit, and the second circuit region form a storing circuit region.

According to the semiconductor device, a junction capacitance is increased as an increase in an area of the interface between the second impurity region and the fourth impurity region and an area of the interface between the fourth impurity region and the semiconductor substrate. As a result, a decoupling capacitor can be formed without increasing an element forming region.

The semiconductor device according to still another aspect of the present invention includes a semiconductor substrate of a first conductivity type, a first impurity layer of a second conductivity type formed at a predetermined depth from the main surface of the semiconductor substrate, a second impurity layer of the first conductivity type formed in contact with the upper surface of the first impurity layer, a third impurity layer of the second conductivity type formed in contact with the upper surface of the second impurity layer and electrically connected to the first impurity layer, and a fourth impurity layer of the first conductivity type formed in contact with the upper surface of the third impurity layer and electrically connected to the second impurity layer. The first impurity layer and the third impurity layer are set to a potential different from that of the second impurity layer and the fourth impurity layer.

Preferably, the first impurity layer and the third impurity layer are set to a ground potential, and the second impurity layer and the fourth impurity layer are set to a power supply potential.

More preferably, the semiconductor device includes an impurity active region on which a semiconductor element is formed between the main surface of the semiconductor substrate and the fourth impurity layer. The impurity active region includes a fifth impurity layer of the first conductivity type electrically connected to the fourth impurity region, and a sixth impurity layer of the second conductivity type electrically connected to the third impurity layer.

A method of manufacturing the above-described semiconductor device includes following steps.

First, into a region at a predetermined depth from the main surface of a semiconductor substrate of a first conductivity type, ions of a second conductivity type are implanted using a first resist film with a high ion energy implantation method to form a first impurity layer of the second conductivity type. Then, ions of the first conductivity type are implanted using a second resist film with a high ion energy implantation method to form a second impurity layer of the first conductivity type so as to partially overlap the first impurity layer.

A third impurity layer of the second conductivity type is formed on the second impurity layer by implanting ions of the second conductivity type using the first resist film with a high ion energy implantation method. Then, a fourth impurity layer of the first conductivity type is formed on the third impurity layer by implanting ions of the first conductivity type using the second resist film with a high ion energy implantation method.

According to the semiconductor device and the method of manufacturing the same, impurity layers of the first conductivity type and impurity layers of the second conductivity type are formed alternately in the depth direction of the semiconductor substrate. As a result, a junction capacitance per unit area is increased, making it possible to obtain a large capacitor with a small area.

The semiconductor device according to a further aspect of the present invention includes a semiconductor region of a first conductivity type, a first impurity region of the first conductivity type formed to have a predetermined depth from the main surface of the semiconductor region, a second impurity region of a second conductivity type formed adjacent to the first impurity region, and an impurity layer of the second conductivity type formed at a predetermined depth from the main surface of the semiconductor region so as to extend over the first impurity region and second impurity region. The first impurity region and the second impurity region are set to different potentials, and the second impurity region and the impurity layer are set to the same potentials.

Preferably, a plurality of the impurity layers are formed at different positions in the depth direction.

More preferably, the first impurity region is set to a ground potential, and the impurity layer is set to a power supply potential.

More preferably, the first impurity region is set to a power supply potential, and the impurity layer is set to a potential lower than the power supply potential.

The semiconductor device according to a further aspect of the present invention includes a semiconductor region of a first conductivity type, a first impurity region of the first conductivity type formed to have a first depth from the main surface of the semiconductor region, a second impurity region of a second conductivity type formed adjacent to the first impurity region to have a second depth greater than the first depth from the main surface of the semiconductor region, and a third impurity region of the second conductivity type formed at a depth between the first depth and the second depth to extend over both the semiconductor region and the second impurity region. The semiconductor region and the third impurity region are set to different potentials.

Preferably, the semiconductor region is set to the ground potential, and the third impurity region is set to a power supply potential.

The semiconductor device according to a further aspect of the present invention includes a semiconductor region of a first conductivity type, a first impurity region of the first conductivity type formed to have a predetermined depth from the main surface of the semiconductor region so as to extend in parallel with the main surface, a second impurity region of a second conductivity type formed adjacent to the first impurity region so as to extend in parallel with the main surface, a third impurity region of the first conductivity type formed adjacent to the second impurity region so as to extend in parallel with the main surface, and a fourth impurity region of the second conductivity type formed adjacent to the third impurity region so as to extend in parallel with the main surface. The first impurity region and the third impurity region are electrically connected to each other at respective one end sides. The second impurity region and the fourth impurity region are electrically connected to each other at the other end sides opposite to the one end sides of the first impurity region and the third impurity region. The first impurity region and the third impurity region are set to a potential different from the that of the second impurity region and the fourth impurity region.

Preferably, the first impurity region and the third impurity region are set to a ground potential, and the second impurity region and the fourth impurity region are set to a power supply potential.

The semiconductor device according to a further aspect of the present invention includes a semiconductor region of a first conductivity type, a first impurity region of the first conductivity type formed to have a predetermined depth from the main surface of the semiconductor region, a second impurity region of a second conductivity type formed so as to extend over the semiconductor region and the first impurity region and to extend in parallel with the main surface of the semiconductor region, and a third impurity region of the second conductivity type formed adjacent to the first impurity region so as to extend in parallel with the second impurity region. The second impurity region and the third impurity region are electrically connected to each other at respective end portions. The first impurity region is connected to a potential different from that of the second impurity region and the third impurity region.

Preferably, the first impurity region is set to a ground potential, and the second impurity region and the third impurity region are set to a power supply potential.

More preferably, a plurality of the second impurity regions are disposed in parallel.

The semiconductor device according to a further aspect of the present invention includes a semiconductor region of a first conductivity type, a first impurity region of the first conductivity type formed to have a predetermined depth from the main surface of the semiconductor region, a second impurity region of a second conductivity type formed adjacent to the first impurity region, a third impurity region of the second conductivity type formed in contact with the lower surface of the first impurity region and the second impurity region, and a fourth impurity region of the second conductivity type formed so as to extend over the first impurity region and the third impurity region. The first impurity region and the fourth impurity region are set to different potentials.

Preferably, the first impurity region is set to a ground potential, and the fourth impurity region is set to a power supply potential.

More preferably, a plurality of the fourth impurity regions are disposed in parallel.

The semiconductor device according to a further aspect of the present invention includes an impurity layer of a first conductivity type having a main surface, a first active region of a second conductivity type formed to have a predetermined depth from the main surface, and a second active region of the second conductivity type formed to be electrically connected to the first active region and to extend downward from the first active region. The impurity layer and the second active region are set to different potentials.

Preferably, the impurity layer is set to a ground potential, and the second active region is set to a power supply potential.

According to the semiconductor device, a junction capacitance can be formed at a deep position in a semiconductor substrate. As a result, a capacitor having a large capacitance can be formed without increasing an area of a circuit device.

The semiconductor device according to a further aspect of the present invention includes a semiconductor substrate of a first conductivity type, a first impurity region of a second conductivity type formed to have a predetermined depth from the main surface of the semiconductor substrate, a second impurity region of the first conductivity type formed in the first impurity region with a predetermined depth from the main surface of the semiconductor substrate and having a first circuit region, a third impurity region of the first conductivity type formed adjacent to the first impurity region with a predetermined depth from the main surface of the semiconductor substrate and having a second circuit region, and a fourth impurity region of the second conductivity type formed with a predetermined depth from the main surface of the semiconductor substrate so as to surround a part of the bottom surface of the third impurity region and having a third circuit region. The first impurity region and the second impurity region are set to a potential different from the third impurity region and the fourth impurity region.

Preferably, the first impurity region is set to a first potential of n type, the fourth impurity region is set to a second potential of n type, the second impurity region is set to a third potential of p type lower than the first potential, and the third impurity region is set to a fourth potential of p type lower than the second potential.

More preferably, the first circuit region and the third circuit region form a peripheral circuit region, and the second circuit region form a storing circuit region.

The semiconductor device according to a further aspect of the present invention includes a semiconductor substrate of a first conductivity type, a first impurity region of the first conductivity type formed to have a predetermined depth from the main surface of the semiconductor substrate and having a first circuit region, a second impurity region of a second conductivity type formed adjacent to the first impurity region with a predetermined depth from the main surface of the semiconductor substrate so as to surround a part of the bottom surface of the first impurity region, a third impurity region of the second conductivity type formed to have a predetermined depth from the main surface of the semiconductor substrate and having a second circuit region, and a fourth impurity region of the first conductivity type formed in the third impurity region with a predetermined depth from the main surface of the semiconductor substrate and having a third circuit region. The first impurity region and the second impurity region are set to different potentials, and the third impurity region and the fourth impurity region are set to different potentials.

Preferably, the second impurity region is set to a first potential of n type, the third impurity region is set to a second potential of n type, the first impurity region is set to a third potential of p type lower than the first potential, and the fourth impurity region is set to a fourth potential of p type lower than the second potential.

More preferably, the first circuit region and the third circuit region form a peripheral circuit region, and the second circuit region form a storing circuit region.

According to the semiconductor device, a junction capacitance is formed at the interface between the first impurity region and the second impurity region. As a result, a decoupling capacitor can be formed without increasing an element forming region. By applying different power supply voltages to the first impurity region and the fourth impurity region, generation of noise caused by change of the power supply voltage can be prevented in advance.

The foregoing and other objects, features, aspects and advantages of the present invention will become more apparent from the following detailed description of the present invention when taken in conjunction with the accompanying drawings.

BRIEF DESCRIPTION OR THE DRAWINGS

DESCRIPTION OF THE PREFERRED EMBODIMENTS

Figure 1:
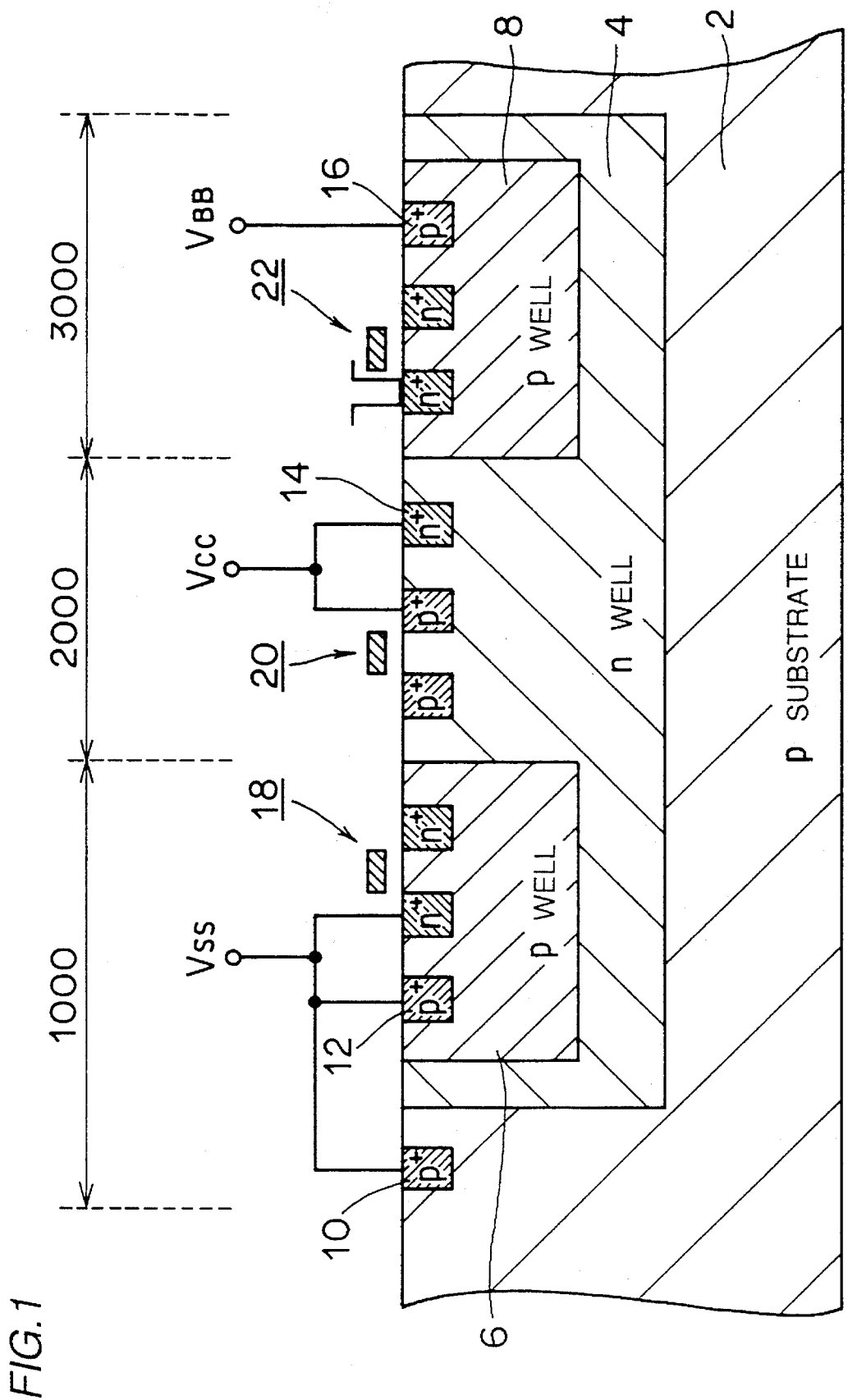
FIG. 1 is a first diagram showing a sectional configuration of a semiconductor device of a first embodiment according to the present invention.

The first embodiment according to the present invention will be described with reference to FIG. 1.

A DRAM includes on a p substrate 2 a peripheral circuit region 1000 including a p well 6 on which an n channel MOS transistor 18 is formed, a peripheral circuit region 2000 including an n well 4 on which a sense amplifier, for example, is formed by a p channel MOS transistor 20 or the like, and a storing circuit region 3000 including a p well 8 on which a memory cell or the like is formed by an n channel MOS transistor 22 or the like.

In peripheral circuit region 1000, the ground potential ($V_{SS}$) is applied to p well 6 through a $p^+$ impurity region 12. In peripheral circuit region 2000, the external power supply potential ($V_{CC}$) is applied to n well 4 through an $n^+$ impurity region 14.

In storing circuit region 3000, an internally generated negative portion ($V_{BB}$) is applied to p well 8 through a $p^+$ impurity region 16. p substrate 2 is supplied with the ground potential ($V_{SS}$) through a $p^+$ impurity region 10.

n well 4 is formed so as to surround p well 8 for isolating p substrate 2 supplied with the ground potential ($V_{SS}$) and p well 8 supplied with the internally generated negative potential ($V_{BB}$). n well 4 is also formed so as to surround p well 6 supplied with the same potential ($V_{SS}$) as that of p substrate 2.

By forming n well 4 under p well 6 which does not have to be isolated from p substrate 2, pn junctions can be formed between p well 6 and n well 4, and between p substrate 2 and n well 4.

Since n well 4 is supplied with the external power supply voltage ($V_{CC}$) and p well 6 and p substrate 2 are supplied with the ground potential ($V_{SS}$), it is possible to form a large decoupling capacitor between $V_{CC}$ and $V_{SS}$ without increasing an area, using peripheral circuit region 1000.

According to this embodiment, a capacitance of approximately 20 nF/cm$^2$ is generated between p well 6 and n well 4, and a capacitance of approximately 5 nF/cm$^2$ is generated between n well 4 and p substrate 2, for example.

Figure 2:
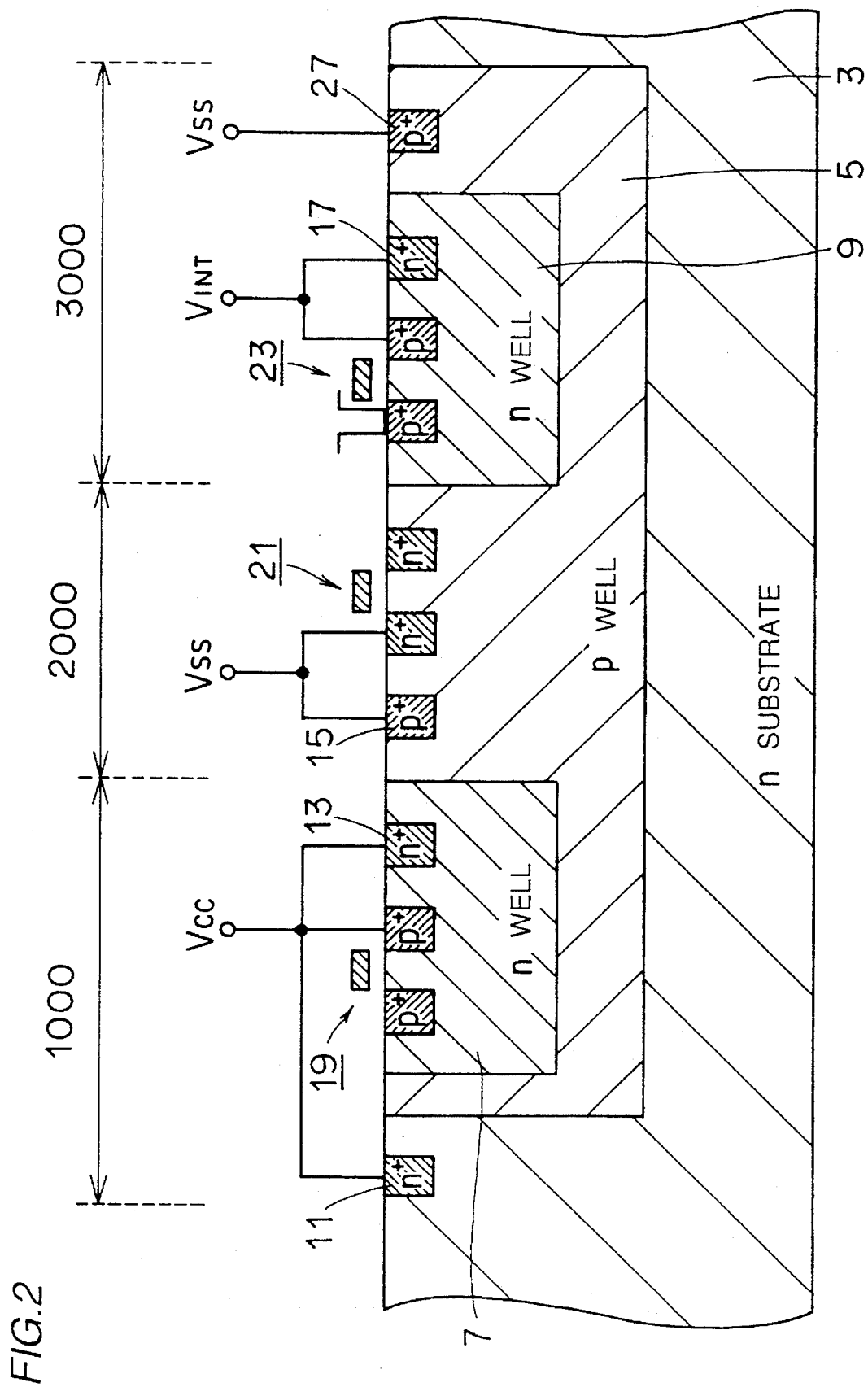
FIG. 2 is a second diagram showing a sectional configuration of the semiconductor device of the first embodiment according to the present invention.

Although the case where p substrate 2 is used is shown in FIG. 1, the same effect can be expected by using an n substrate as shown in FIG. 2.

In a configuration of FIG. 2, an n substrate 3 includes peripheral circuit region 1000 including an n well 7 on which a p channel MOS transistor 19 is formed, peripheral circuit region 2000 including a p well 5 on which a sense amplifier, for example, is formed by an n channel MOS transistor 21 or the like, and storing circuit region 3000 including an n well 9 on which a memory cell or the like is formed by a p channel MOS transistor 23 or the like.

In peripheral circuit region 1000, the external power supply potential ($V_{CC}$) is applied to n well 7 through an $n^+$ impurity region 13. In peripheral circuit region 2000, the ground potential ($V_{SS}$) is applied to p well 5 through a $p^+$ impurity region 15.

In storing circuit region 3000, the internal power supply potential ($V_{INT}$) is applied to n well 9 through an n$^+$ impurity region 17. The external power supply potential ($V_{CC}$) is applied to n substrate 3 through an n$^+$ impurity region 11.

Also by this configuration, it is possible to form a decoupling capacitor between $V_{CC}$ and $V_{SS}$ without increasing an area, using the lower portion of peripheral circuit region 1000.

The second embodiment according to the present invention will now be described with reference to FIGS. 3 and 4.

Figure 3:
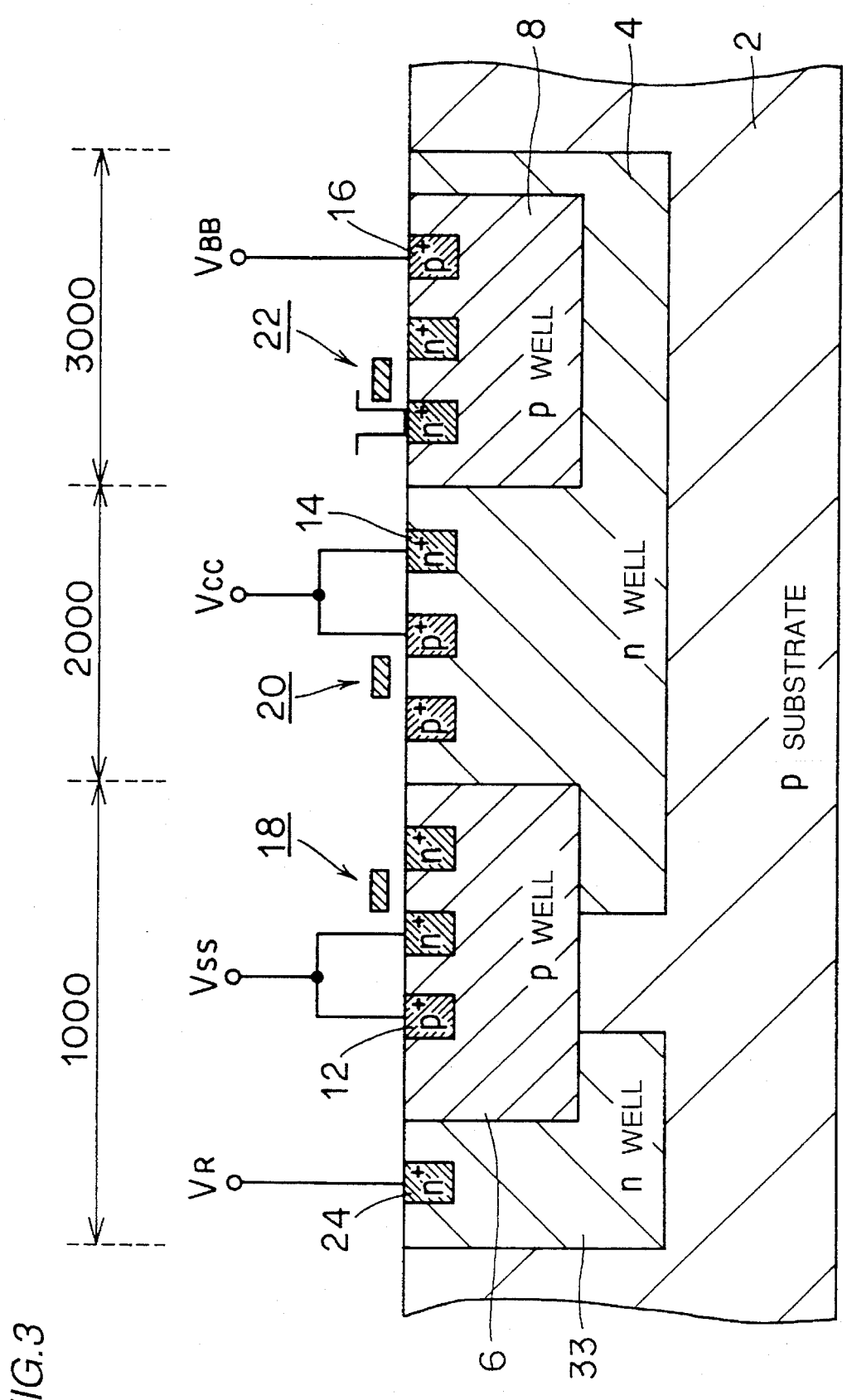
FIG. 3 is a first diagram showing a sectional configuration of a semiconductor device of a second embodiment according to the present invention.

Referring to FIG. 3, a DRAM includes on p substrate 2 peripheral circuit region 1000 including p well 6 on which n channel MOS transistor 18 is formed, peripheral circuit region 2000 including n well 4 on which a sense amplifier, for example, is formed by p channel MOS transistor 20 or the like, and storing circuit region 3000 including p well 8 on which a memory cell or the like is formed by n channel MOS transistor 22 or the like.

n well 4 is formed so as to surround p well 8 and to also surround a part of p well 6.

In peripheral circuit region 1000, an n well 33 is formed so as to surround a part of p well 6.

In peripheral circuit region 1000, the ground potential ($V_{SS}$) is applied to p well 6 through p$^+$ impurity region 12. n well 33 is supplied with an internal reference potential ($V_R$) such as a bit line precharge potential ($V_{BC}$) through an n$^+$ impurity region 24.

In peripheral circuit region 2000, the external power supply potential ($V_{CC}$) is applied to n well 4 through n$^+$ impurity region 14. In storing circuit region 3000, the internally generated negative potential ($V_{BB}$) is applied to p well 8 through p$^+$ impurity region 16.

According to the above embodiment, in addition to the decoupling capacitor between $V_{CC}$ and $V_{SS}$, a decoupling capacitor between $V_R$ and $V_{SS}$ can be formed by provision of n well 33.

It should be noted that the potential of p substrate 2 is applied by p well 6 in this embodiment.

Figure 4:
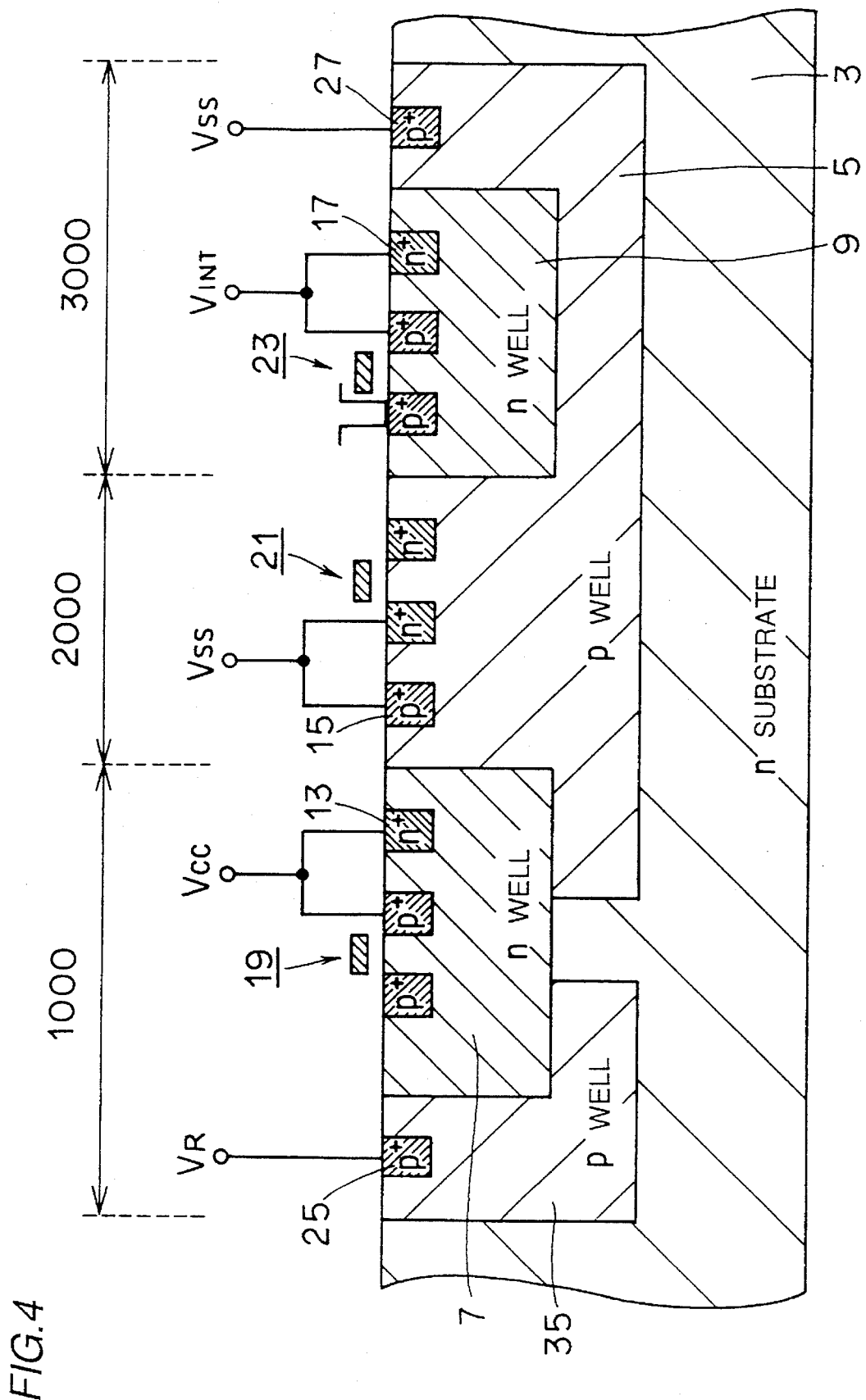
FIG. 4 is a second diagram showing a sectional configuration of the semiconductor device of the second embodiment according to the present invention.

Although p substrate 2 is used in the above embodiment, the same effect can be expected by using an n substrate as shown in FIG. 4.

A DRAM shown in FIG. 4 includes on n substrate 3 peripheral circuit region 1000 including n well 7 on which p channel MOS transistor 19 is formed, peripheral circuit region 2000 including p well 5 on which a sense amplifier, for example, is formed by p channel MOS transistor 21 or the like, and storing circuit region 3000 including n well 9 on which a memory cell or the like is formed by n channel MOS transistor 23 or the like.

In peripheral circuit region 1000, the external power supply potential ($V_{CC}$) is applied to n well 7 through n$^+$ impurity region 13. p well 25 is supplied with the internal reference potential ($V_R$) through p$^+$ impurity region 15.

In peripheral circuit region 2000, the ground potential ($V_{SS}$) is applied to p well 5 through p$^+$ impurity region 15. In storing circuit region 3000, the internal power supply potential ($V_{INT}$) is applied to n well 9 through n$^+$ impurity region 17.

Also by the above configuration, it is possible to form decoupling capacitors between $V_{CC}$ and $V_{SS}$ and between $V_{CC}$ and $V_R$.

The third embodiment according to the present invention will be described with reference to FIGS. 5 to 9.

Figure 5:
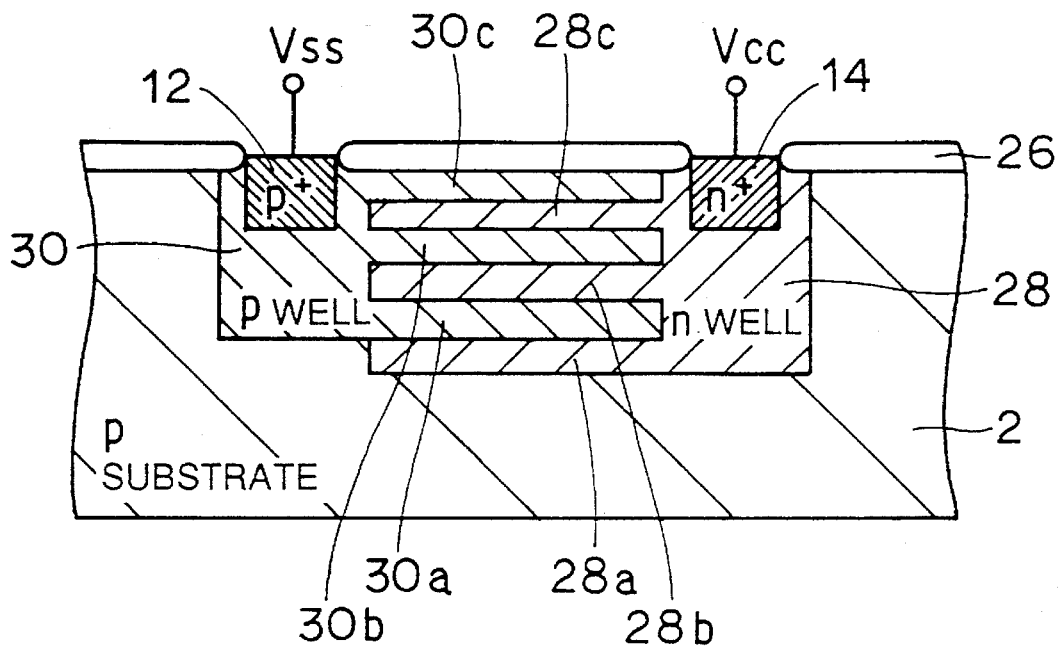
FIG. 5 is a sectional view showing a configuration of a semiconductor device of a third embodiment according to the present invention.

Referring to FIG. 5, a first n well 28a is formed at a predetermined depth from the main surface of p substrate 2.

A first p well 30a is formed on first n well 28a partially in contact therewith. A second n well 28b is further formed on first p well 30a partially in contact therewith and electrically connected to first n well 28a.

A second p well 30b is formed on second n well 28b partially in contact therewith and electrically connected to first p well 30a. A third n well 28c is further formed on second p well 30b partially in contact therewith and electrically connected to second n well 28b.

A third p well 30c is formed on third n well 28c partially in contact therewith and electrically connected to second p well 30b.

First n well 28a, second n well 28b, and third n well 28c form n well 28. First p well 30a, second p well 30b, and third p well 30c form p well 30.

n well 28 is supplied with the external power supply voltage ($V_{CC}$) through n$^+$ impurity region 14, and p well 30 is supplied with the ground potential ($V_{SS}$) through p$^+$ impurity region 12.

By using the above configuration, a pn interface area per unit area between first to third n wells 28a, 28b, 28c and first to third p wells 30a, 30b, 30c becomes large, making it possible to obtain a large capacitor with a small area.

A method of manufacturing a capacitor of the above configuration will now be described with reference to FIGS. 6 to 9.

Figure 6:
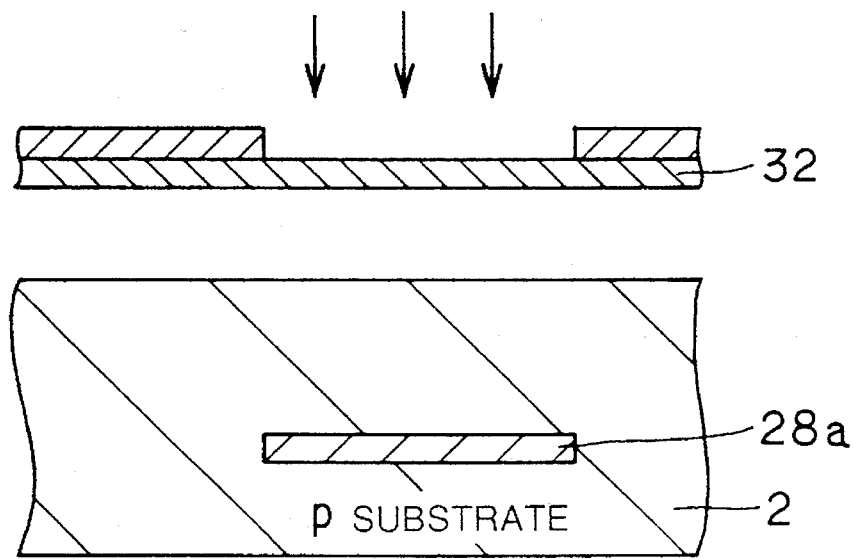
FIGS. 6 to 9 are sectional views showing the first to the fourth steps of the manufacturing process of the semiconductor device of the third embodiment according to the present invention.

Referring to FIG. 6, n type impurity ions such as boron are implanted into p substrate 2 using an n well formation resist mask 32 with a high ion energy implantation method to form first n well 28a in p substrate 2.

Figure 7:
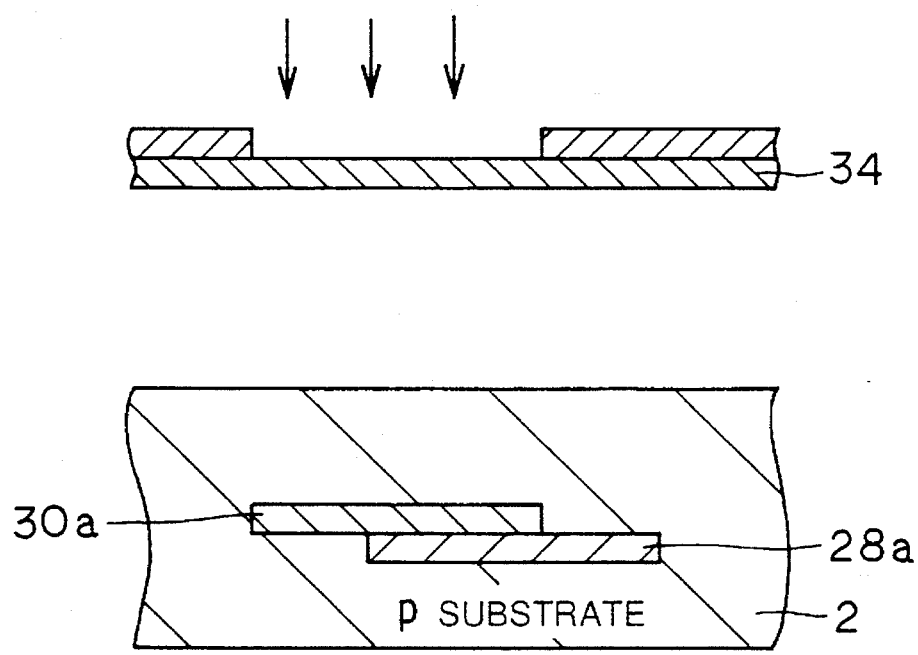

Referring to FIG. 7, p type impurity ions such as phosphorus are implanted using a p well formation resist mask 34 with a high ion energy implantation method to form first p well 30a on first n well 28a partially in contact therewith.

Figure 8:
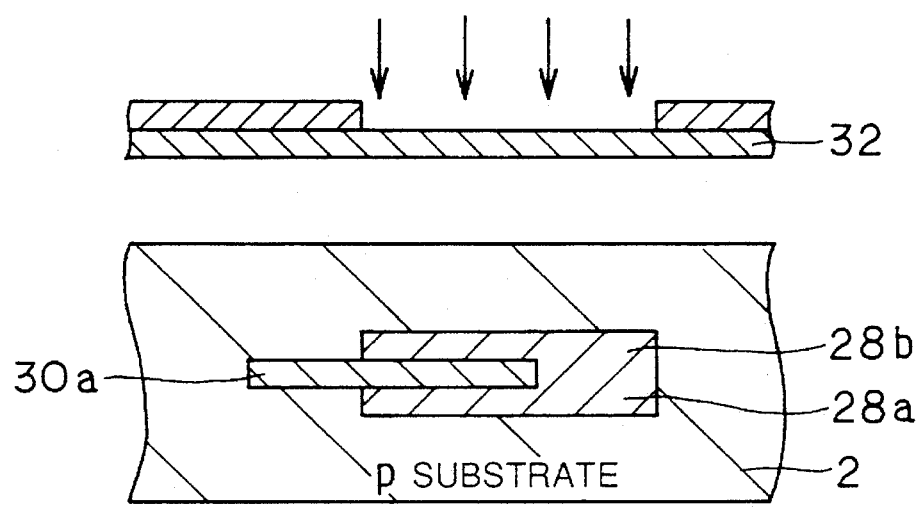

Referring to FIG. 8, n type impurity ions such as boron are implanted again using n well formation resist mask 32 with a high ion energy implantation method to form second n well 28b on first p well 30a partially in contact therewith.

Since first p well 30a does not exist at the right end side of first n well 28a and second n well 28b, the n type impurity ions are more or less diffused in the vertical direction. As a result, first n well 28a and second n well 28b are electrically connected.

Figure 9:
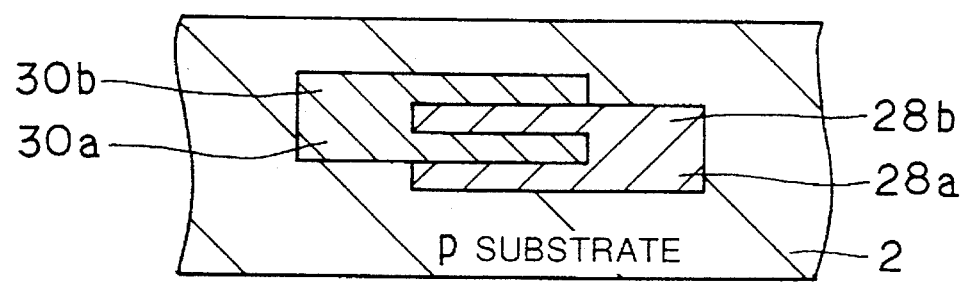

Referring to FIG. 9, p type impurity ions such as phosphorus are implanted again using p well formation resist mask 34 with a high ion energy implantation method to form second p well 30b on second n well 28b partially in contact therewith.

Similar to the above, since second n well 28b does not exist at the left end side of first p well 30a and second p well 30b, p type impurity ions are more or less diffused in the vertical direction. As a result, first p well 30a and second p well 30b are electrically connected.

By repeating the above operation, third n well 28c and third p well 30c are formed.

As described above, by forming impurity layers of predetermined concentration at predetermined depth by sequentially changing implantation energy using a high ion energy implantation method, it is possible to form p wells and n wells alternately in the depth direction of the substrate.

By using the high ion energy implantation method, impurities are not thermally diffused. Therefore, an impurity concentration profile of an interface between the p well and the n well can be easily set.

Although the above description is given of a method of forming p wells and n wells using a high ion energy implantation method, the same configuration can be formed with a well formation method by thermal diffusion.

Although p substrate 2 is used in the above embodiment, the same effect can be expected by using an n substrate.

Figure 10:
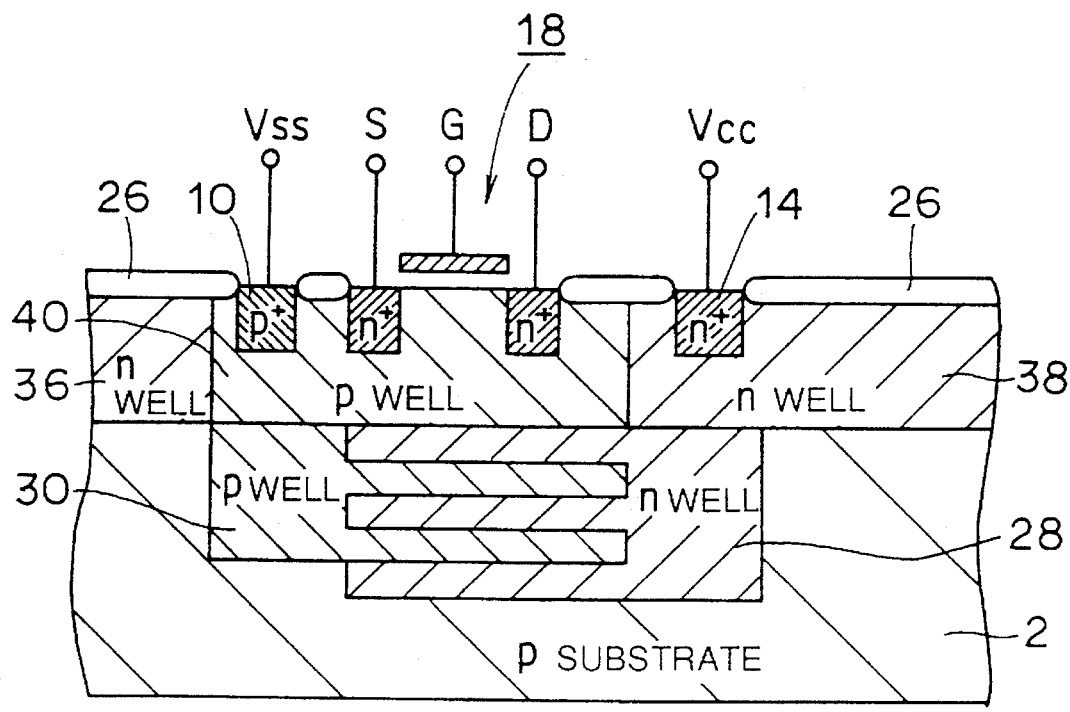
FIG. 10 is a sectional view showing a configuration of a semiconductor device of a fourth embodiment according to the present invention.

The fourth embodiment according to the present invention will now be described with reference to FIG. 10.

In this embodiment, the capacitor shown in the third embodiment is formed under a forming region of a device such as a transistor.

A p well 40 and n wells 36, 38 serving as device forming regions are formed on the main surface of p substrate 2. An insulating film 26 is formed on the main surface of p substrate 2.

n channel MOS transistor 18 is formed on p well 40. p well 40 is supplied with the ground potential ($V_{SS}$) through $p^+$ impurity region 10. n well 38 is supplied with +the external power supply potential ($V_{CC}$) through $n^+$ impurity region 14.

The same capacitor as shown in the third embodiment is formed under p well 40 and n well 38. n well 28 is set to the same potential as that of n well 38, and p well 30 is set to the same potential as p well 40.

As described above, in the fourth embodiment, by forming a capacitor in the substrate under a region in which ordinary circuit devices are formed, a pn interface can be obtained by a p well and an n well of a high impurity concentration at a deep position in the substrate. Therefore, a capacitor having a large capacitance can be formed without increasing an area of the circuit device.

Although p substrate 2 is used in this embodiment, the same effect can be expected by using an n substrate.

Figure 11:
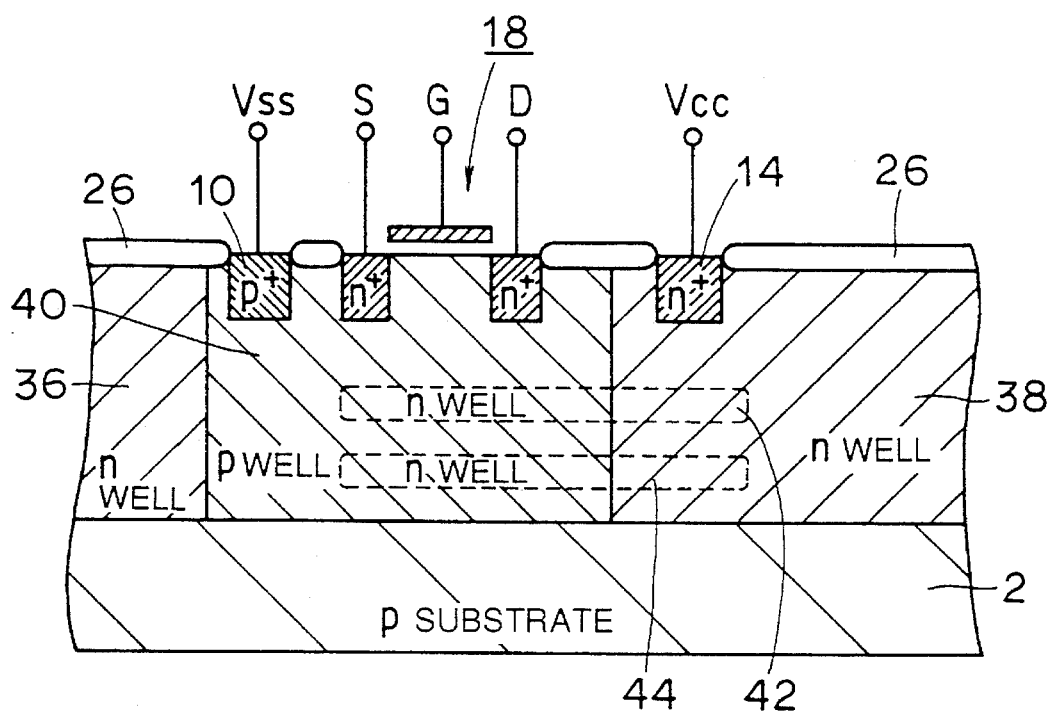
FIG. 11 is a sectional view showing a configuration of a semiconductor device of a fifth embodiment according to the present invention.

The fifth embodiment according to the present invention will be described with reference to FIG. 11.

In this embodiment, a capacitor is formed in p well and n well 38 serving as a device forming region shown in the fourth embodiment.

Therefore, n well 42 and n well 44 are supplied with the external power supply voltage ($V_{CC}$) through n well 38.

As a result, a capacitor equivalent to the capacitor shown in FIG. 5 is formed in p well 40.

In this embodiment, a capacitor can be formed only by formation of n wells 42, 44 in p well 40.

A device area is not increased by using a region in the substrate under the circuit device forming region.

Although p substrate 2 is used in this embodiment, the same effect can be expected by using an n substrate.

Figure 12:
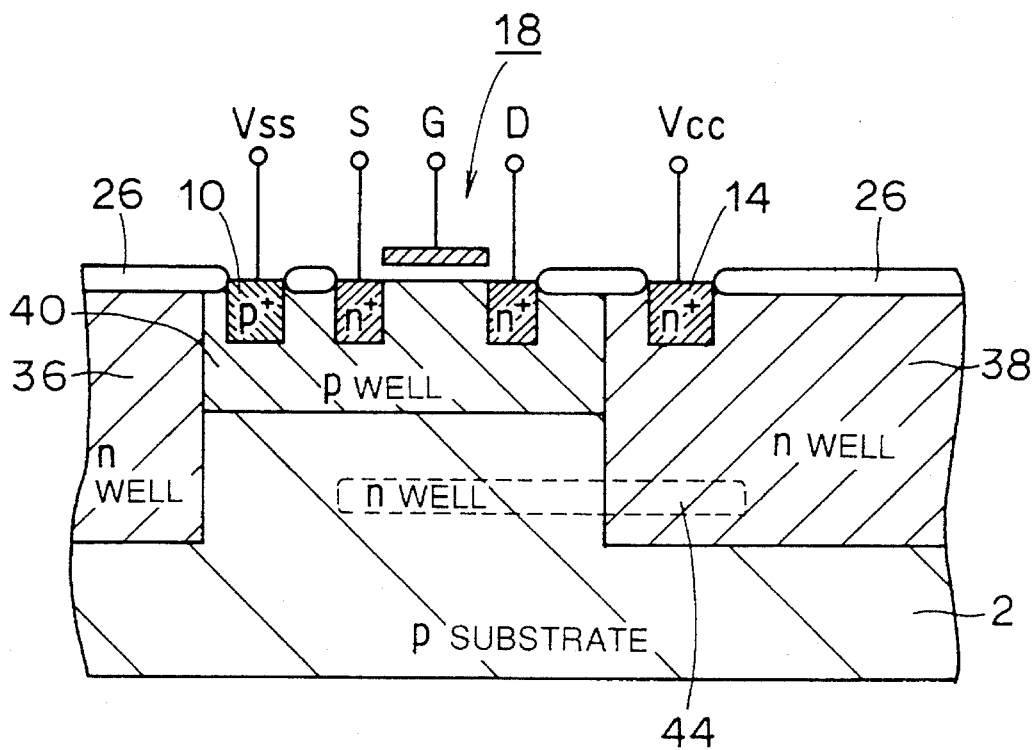
FIG. 12 is a sectional view showing a configuration of a semiconductor device of a sixth embodiment according to the present invention.

The sixth embodiment according to the present invention will now be described with reference to FIG. 12.

In this embodiment, an n well 44 is formed in p substrate 2 through n well 38, with p well 40 of the semiconductor device shown in the fifth embodiment formed to have a small depth from the main surface of the substrate.

In this embodiment, n well 44 is supplied with the external power supply potential ($V_{CC}$) through n well 38. A capacitor is to be formed between p substrate 2 supplied with the ground potential ($V_{SS}$) through p well 40 and n well 44.

In this embodiment, a capacitor can be formed by forming n well 44 in p substrate 2 with p well 40 formed to have a small depth. A device area is not increased by using a region in the substrate under the circuit device forming region.

Although p substrate 2 is used in this embodiment, the same effect can be expected by using an n substrate.

Figure 13:
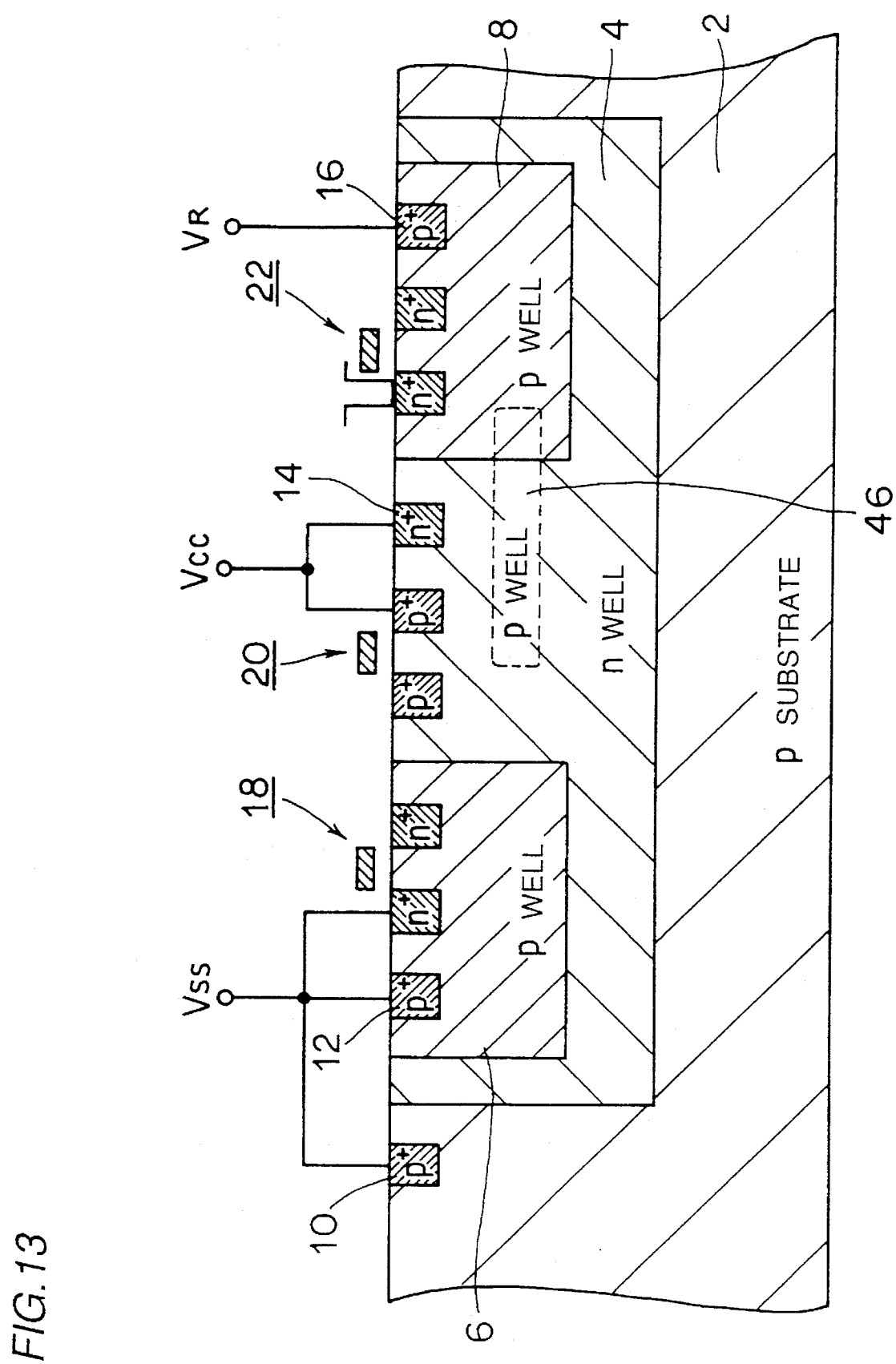
FIG. 13 is a sectional view showing a configuration of a semiconductor device of a seventh embodiment according to the present invention.

The seventh embodiment according to the present invention will now be described with reference to FIG. 13.

In this embodiment, a p well 46 is formed extending over p well 8 and n well 4.

In this case, p well 46 is supplied with an internal reference potential ($V_R$) such as the internally generated negative potential ($V_{BB}$), for example, different from p substrate 2 through p well 8.

Comparison is made between the configuration of the embodiment shown in FIG. 1 and that of this embodiment. The configuration shown in FIG. 1 is effective when the $V_R$ potential is higher than the potential of p substrate 2 since a capacitor capacitance is formed using n well 4.

On the other hand, the configuration of this embodiment is effective when the $V_R$ potential is lower than the potential of n well 4 since a capacitor capacitance is formed using p well 46 and p well 8.

In this embodiment, since n well 4 is supplied with the external power supply potential ($V_{CC}$), a capacitance is formed between the $V_R$ potential and the external power supply potential ($V_{CC}$). However, n well 4 may be supplied with a potential other than the external power supply potential ($V_{CC}$).

The eighth embodiment according to the present invention will now be described with reference to FIG. 14.

In this embodiment, n substrate 3 is used, unlike the configuration of the seventh embodiment described above, in which a p substrate is used.

This embodiment shows the case where a capacitance is formed between the internal reference potential ($V_R$) different from that of n substrate 3 and the ground potential ($V_{SS}$).

The configuration shown in FIG. 2 is effective when the $V_R$ potential is lower than n substrate 3 since a capacitance is formed using p well 5.

Figure 14:
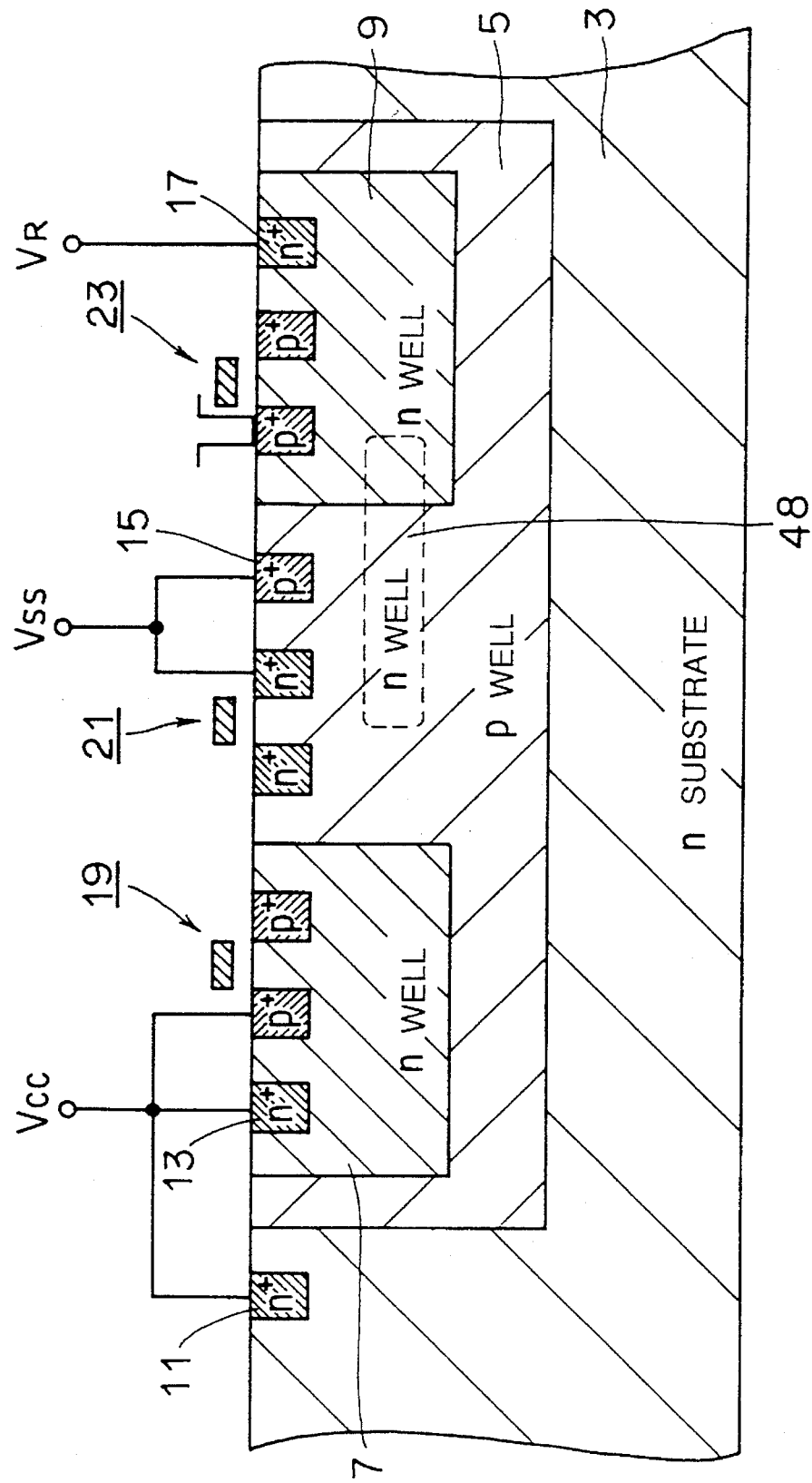
FIG. 14 is a sectional view showing a configuration of a semiconductor device of an eighth embodiment according to the present invention.

On the other hand, in the configuration of this embodiment shown in FIG. 14, a capacitance is formed using n well 48 and n well 9. The $V_R$ potential can be a potential higher than that of n substrate 3, if it is higher than that of p well 5.

Also in this embodiment, p well 5 may be supplied with a potential other than the ground potential ($V_{SS}$).

The ninth embodiment according to the present invention will be described with reference to FIGS. 15 to 17.

Figure 15:
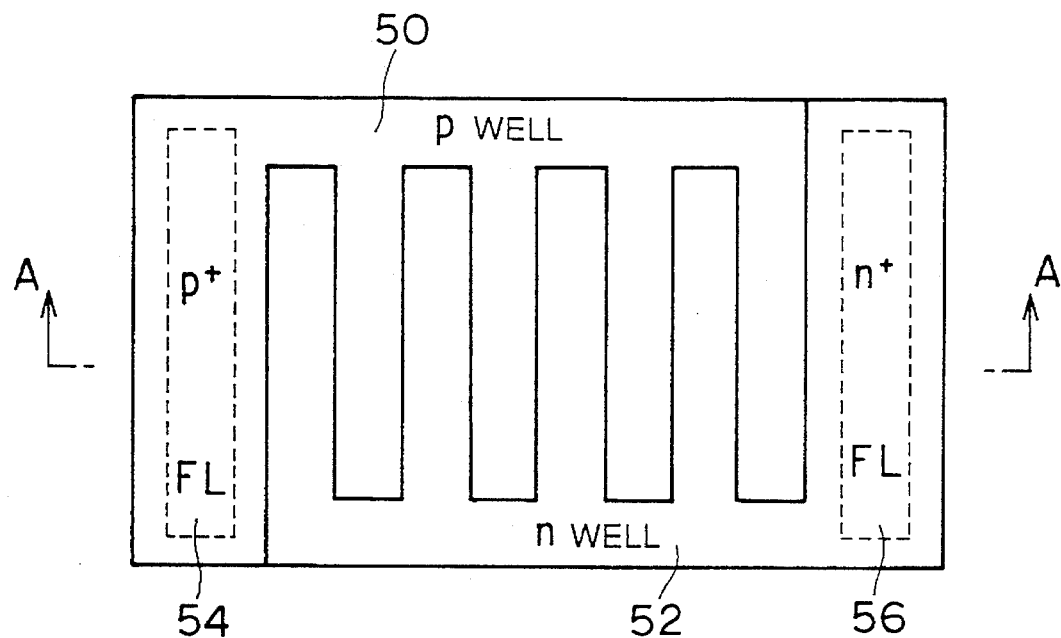
FIG. 15 is a plan view of a semiconductor device of a ninth embodiment according to the present invention.

FIG. 15 is a plan view of a capacitor according to this embodiment. FIG. 16 is a sectional view taken along the line A—A in FIG. 15.

Referring to the figures, p wells 50a to 50e and n wells 52a to 52e are alternately disposed along the main surface of p substrate 2. p wells 50a to 50e and n wells 52a to 52e are electrically connected at respective one end sides. p wells 50a to 50e form p well 50, and n wells 50a to 50e form n well 52.

p well 50 is supplied with the ground potential ($V_{SS}$) through a $p^+$ impurity region 54. n well 52 is supplied with the external power supply voltage ($V_{CC}$) through an n impurity region 56.

By alternately disposing p wells 50a to 50e and n wells 52a to 52e, a pn interface area per unit area becomes large, making it possible to form a capacitor of a large capacitance with a small area.

p wells 50a to 50e and n wells 52a to 52e can be easily formed alternately with a high ion energy implantation method.

Figure 16:
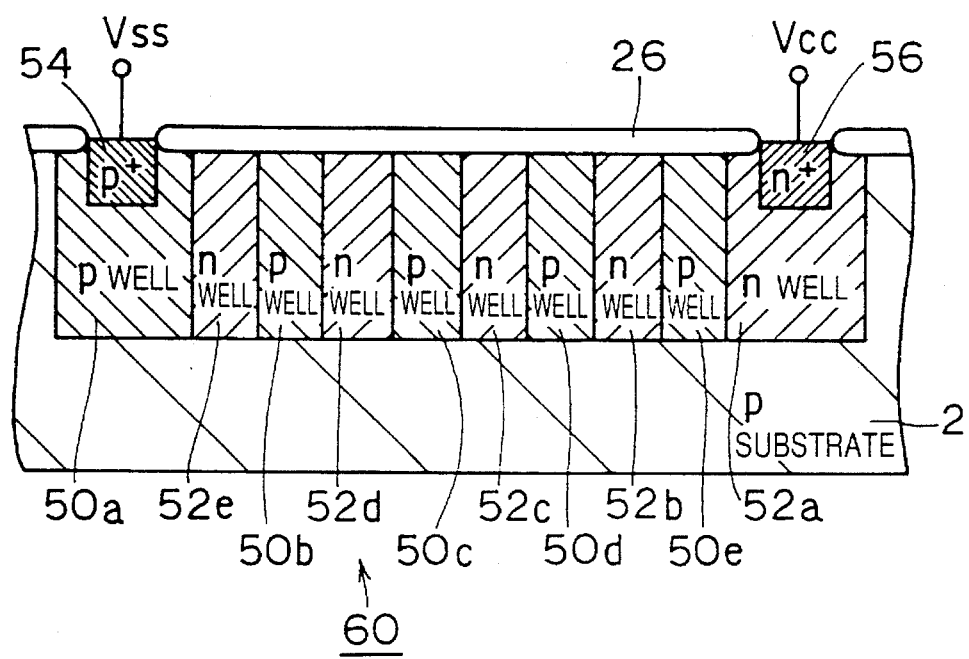
FIG. 16 is a first sectional view showing the configuration of the semiconductor device of the ninth embodiment according to the present invention.

Although description is given of the case where p substrate 2 is used in FIGS. 15 and 16, the same effect can be expected by using an n substrate.

Figure 17:
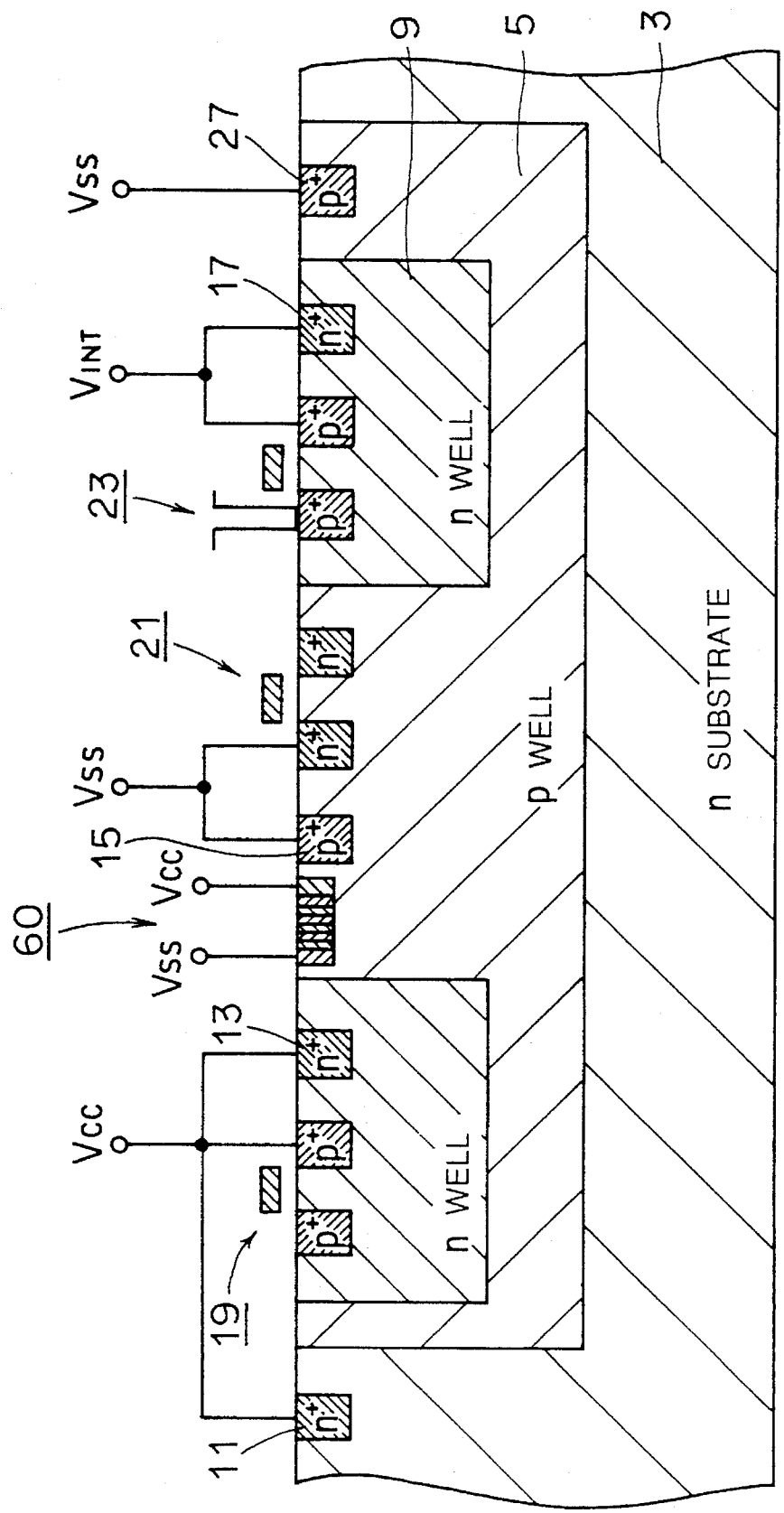
FIG. 17 is a second sectional view showing a configuration of the semiconductor device of the ninth embodiment according to the present invention.

FIG. 17 is a sectional view in the case where the capacitor shown in FIGS. 15 and 16 is formed on the main surface of p well 5 of the DRAM shown in FIG. 1.

By using a capacitor having a large capacitance with a small area as described above, it is possible to further increase a capacitance of a decoupling capacitor without forming a capacitor of an MOS transistor, unlike the conventional case, and to minimize increase of the element area.

The tenth embodiment according to the present invention will now be described with reference to FIGS. 18 to 20.

Figure 18:
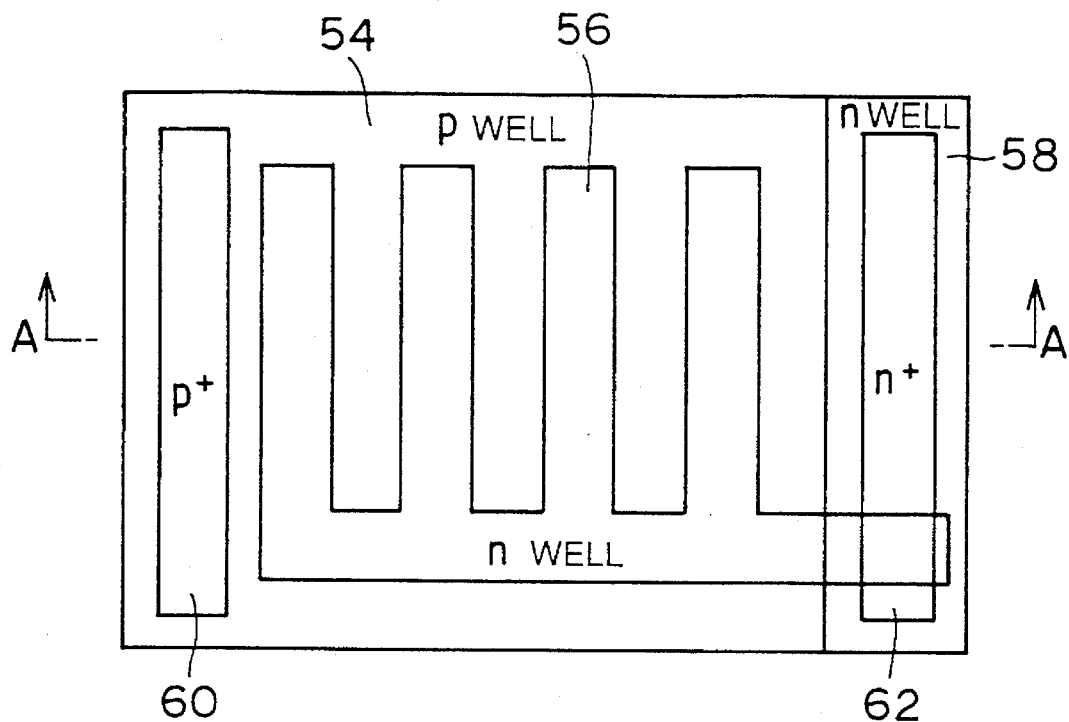
FIG. 18 is a plan view of a semiconductor device of a tenth embodiment according to the present invention.
Figure 19:
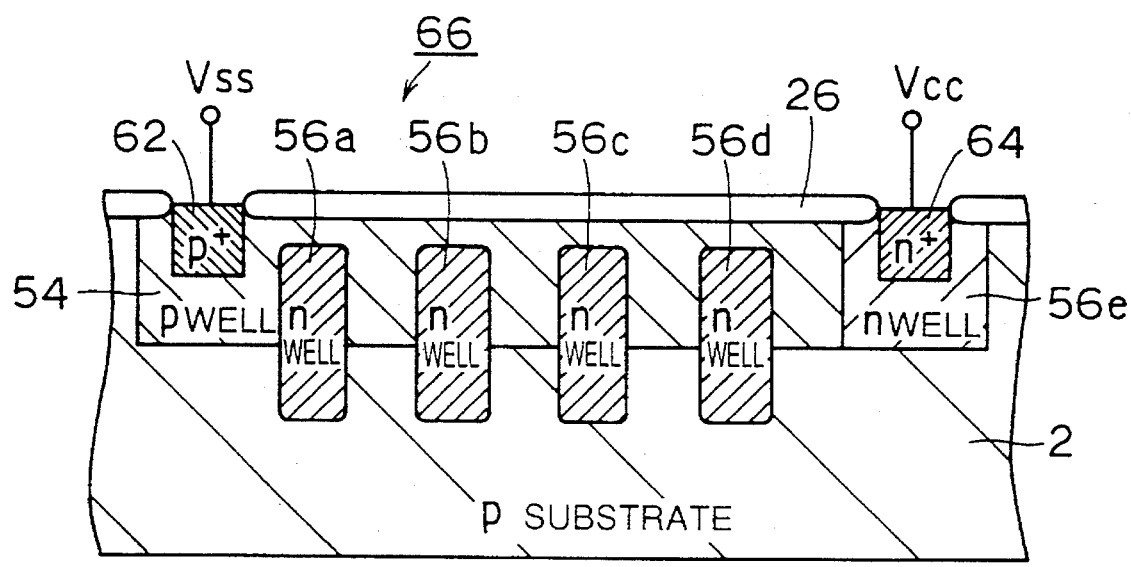
FIG. 19 is a first sectional view showing a configuration of the semiconductor device of the tenth embodiment according to the present invention.

Referring to FIGS. 18 and 19, a p well 54 is formed to a have a predetermined depth from the main surface of p substrate 2. A plurality of n wells 56a to 56d are disposed in p well 54 so as to extend over p substrate 2.

n wells 56a to 56d are electrically connected to n well 56e at respective one end sides. n wells 56a to 56e form n well 56.

p well 54 is supplied with the ground potential ($V_{SS}$) through a $p^+$ impurity region 62. n well 56 is supplied with the external power supply potential ($V_{CC}$).

By disposing a plurality of n wells in a p well at a predetermined interval, a pn interface area per unit area can be increased, making it possible to form a large capacitor with a small area.

Figure 20:
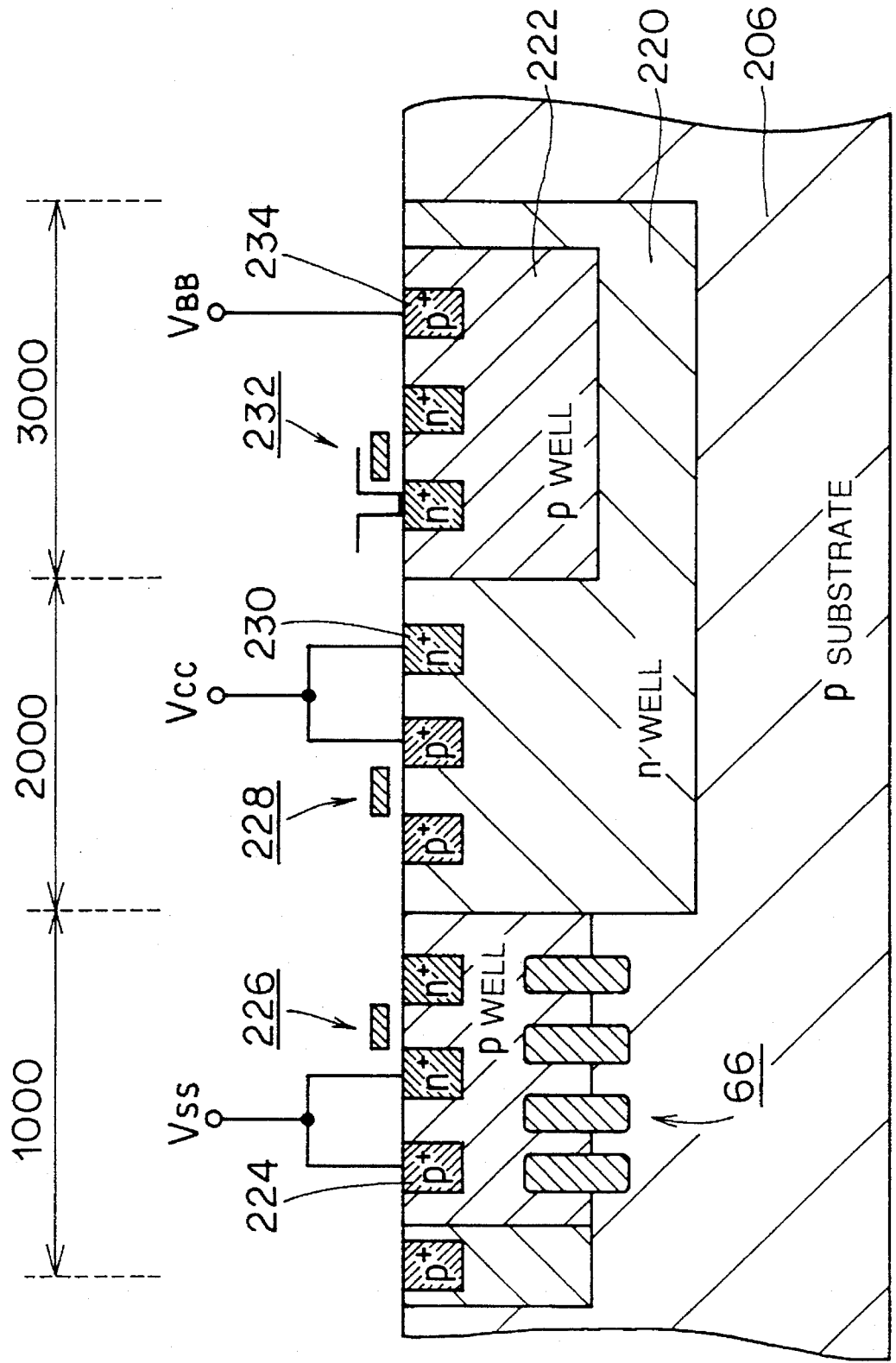
FIG. 20 is a second sectional view showing a configuration of the semiconductor device of the tenth embodiment according to the present invention.
Figure 33:
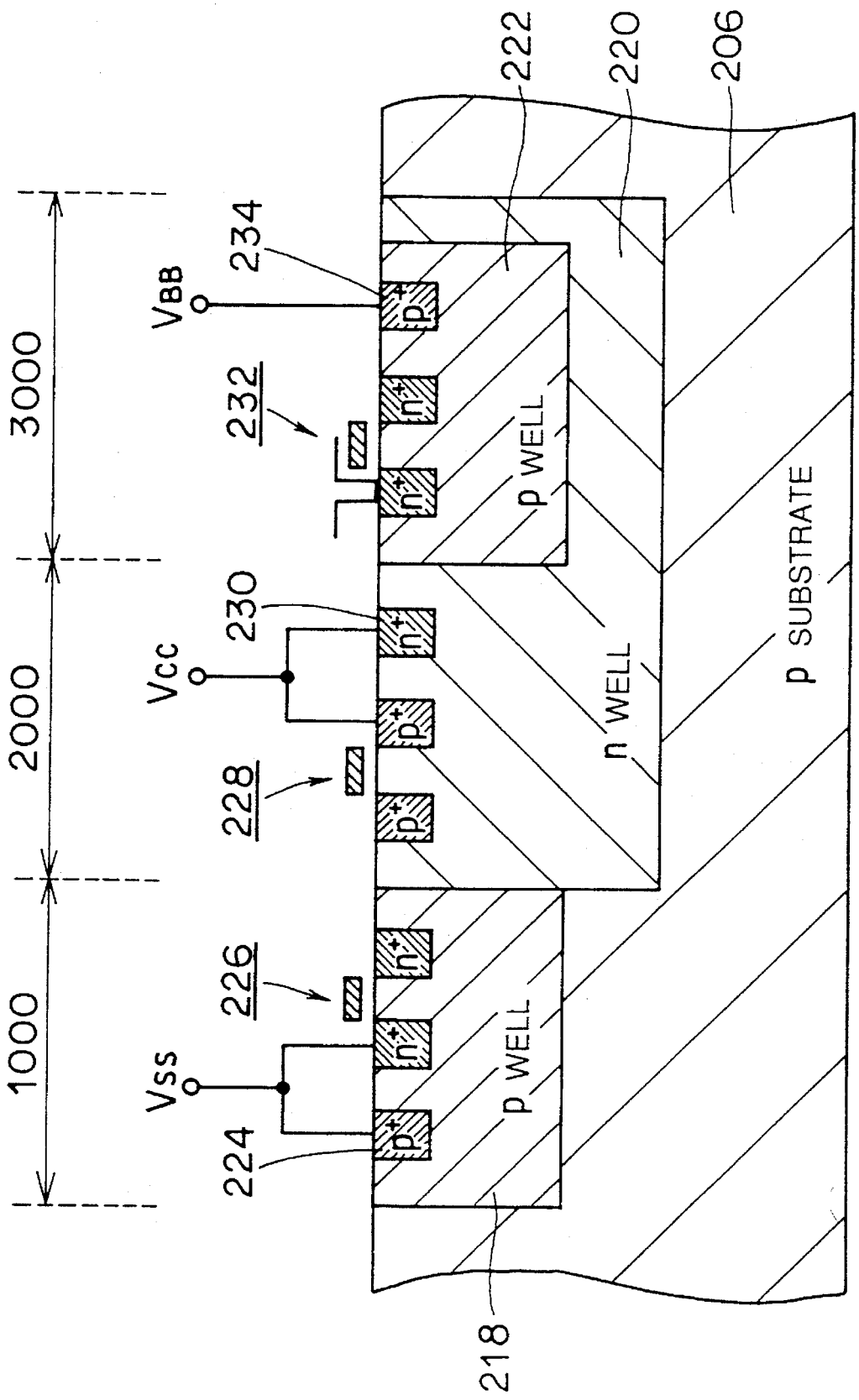
FIGS. 33 to 36 are first to fourth sectional views showing a configuration of the conventional semiconductor device.
Figure 34:
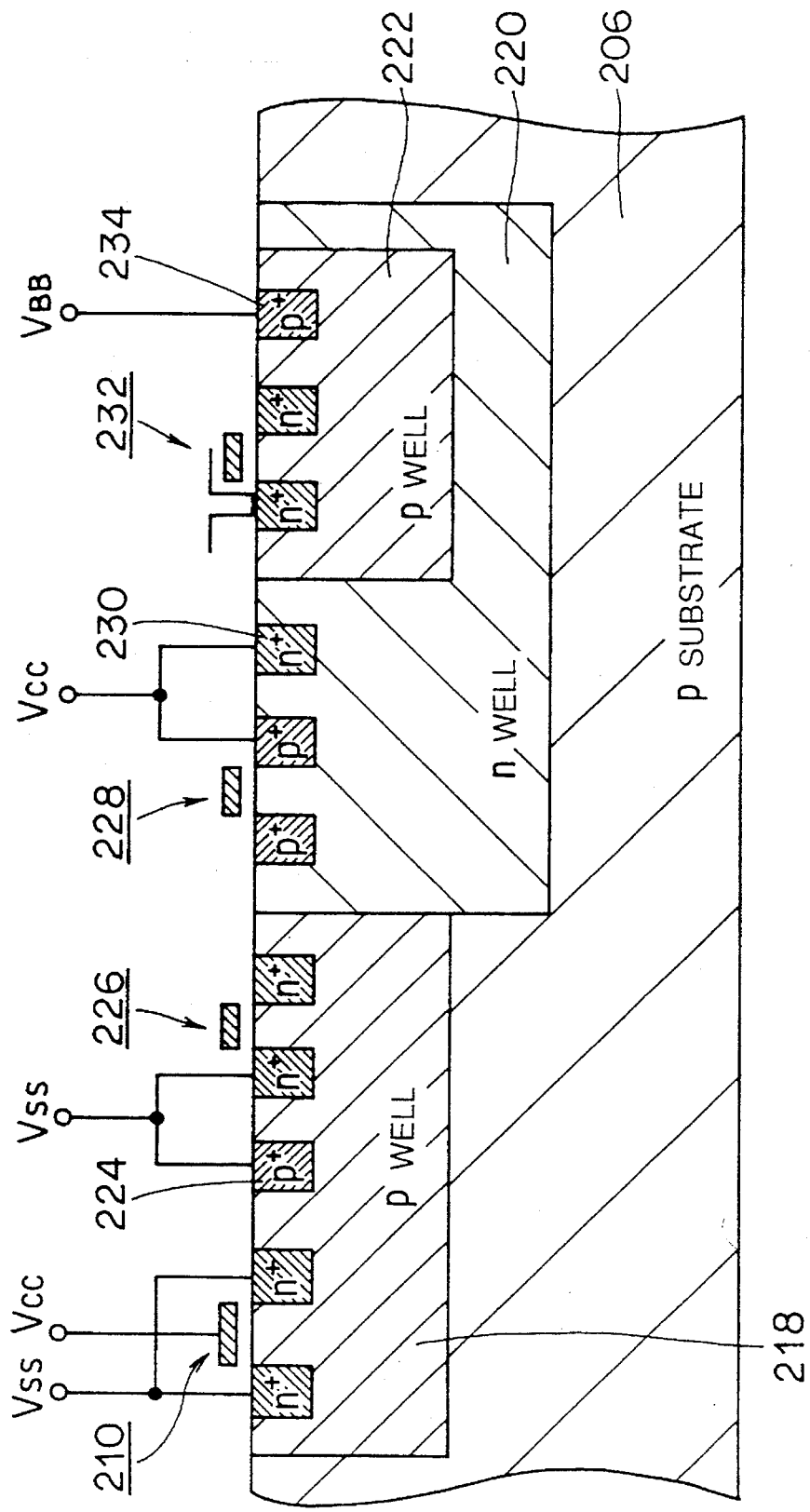
Figure 35:
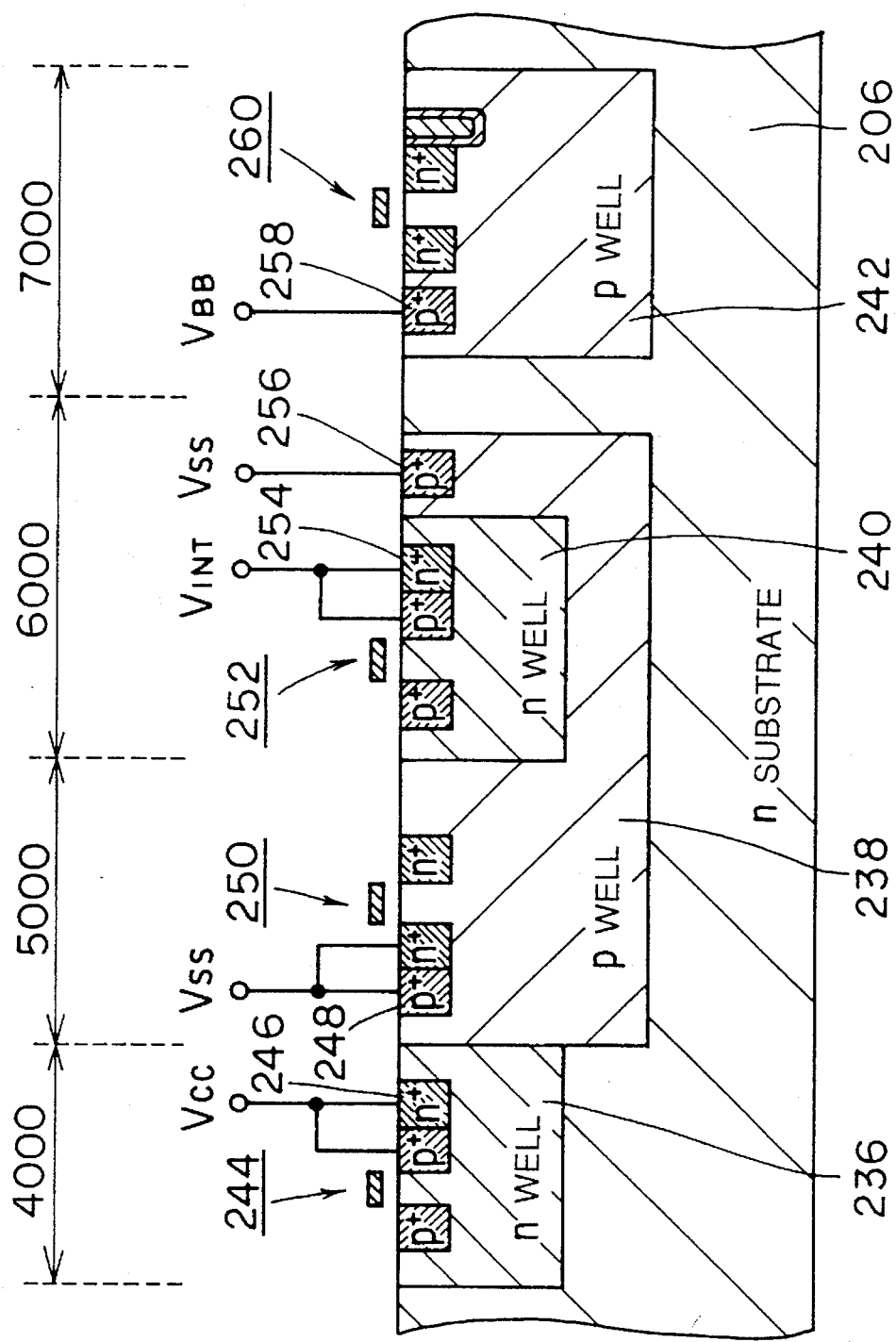
Figure 36:
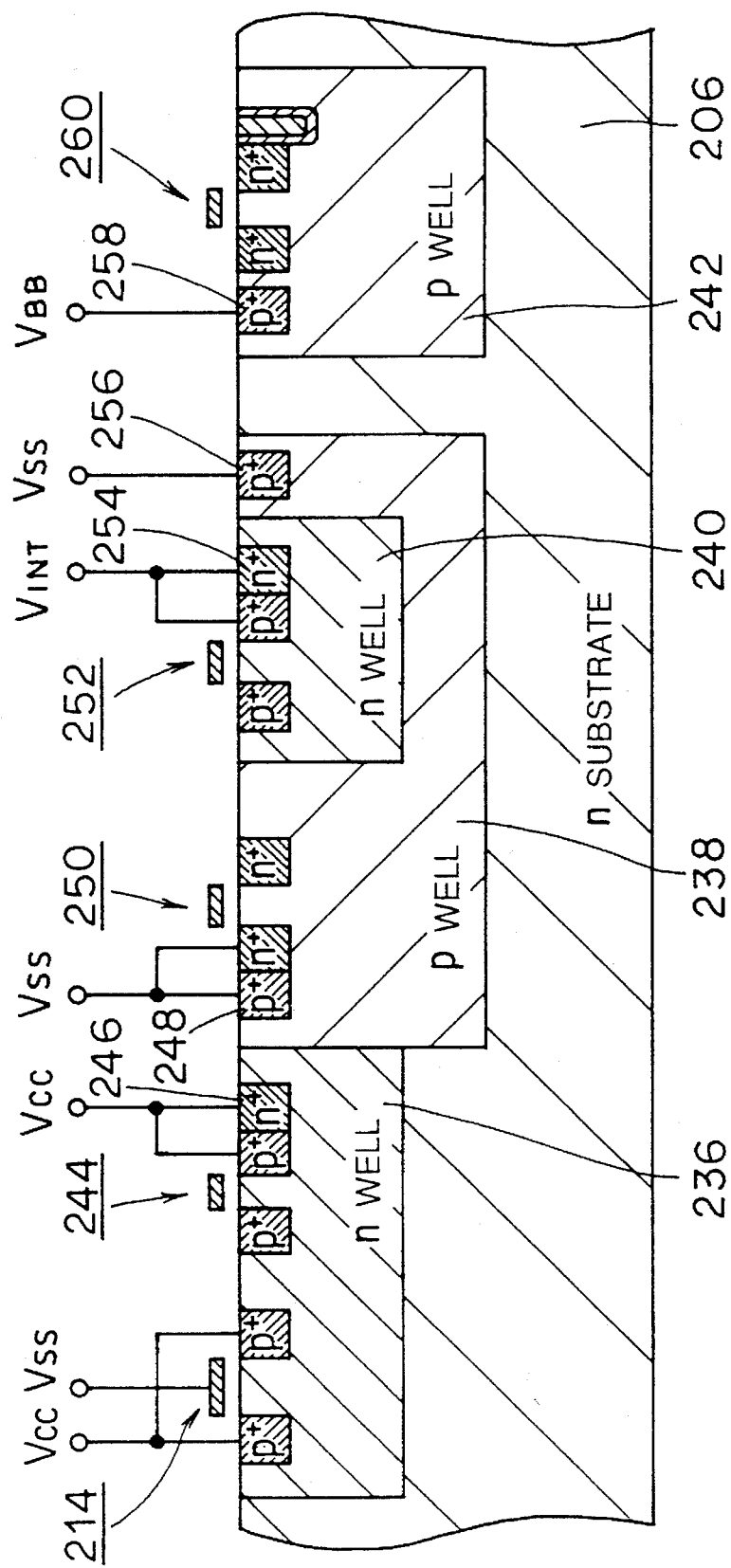

Referring to FIG. 20, the above-described capacitor is provided in a p well in peripheral circuit region 1000 of the DRAM shown in FIG. 33.

According to this embodiment, it is possible to form a capacitor under a device such as a transistor, making it possible to form a capacitor without increasing an area.

Although description is given of the case where a p substrate is used in this embodiment, the same effect can be expected by using an n substrate.

The eleventh embodiment according to the present invention will be described with reference to FIGS. 21 to 23.

Figure 21:
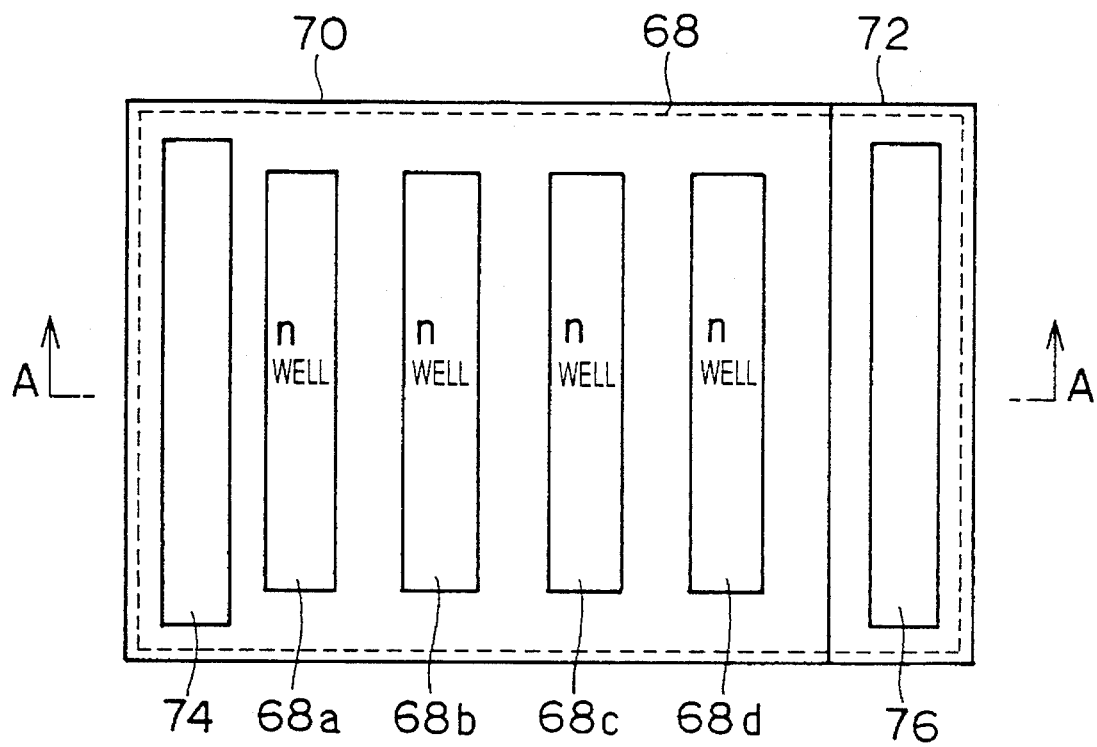
FIG. 21 is a plan view of a semiconductor device of an eleventh embodiment according to the present invention.
Figure 22:
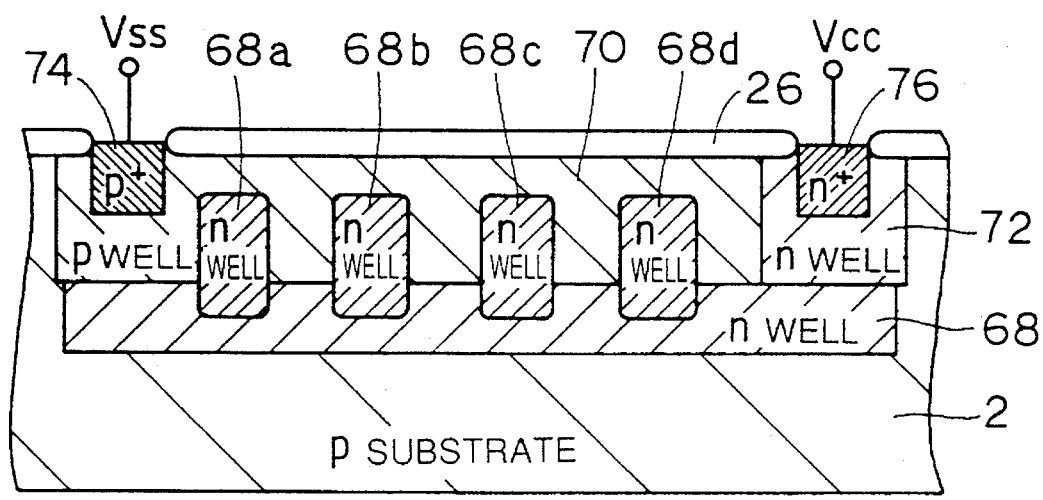
FIG. 22 is a first sectional view showing a configuration of the semiconductor device of the eleventh embodiment according to the present invention.

Referring to FIGS. 21 and 22, a p well 70 is formed to have a predetermined depth from the main surface of p substrate 2. An n well 68 is further formed under p well 70.

A plurality of n wells 68a to 68d are disposed extending over p well 70 and n well 68. Therefore, n wells 68a to 68d are electrically connected by n well 68.

p well 72 is supplied with the ground potential ($V_{SS}$) through a $p^+$ impurity region 74. n well 68 is supplied +with the external power supply potential ($V_{CC}$) through an n well 72 and an $n^+$ impurity region 76.

Similar to the tenth embodiment, a pn interface area per unit area can be increased also in this embodiment, making it possible to form a capacitor having a large capacitance with a small area.

Figure 23:
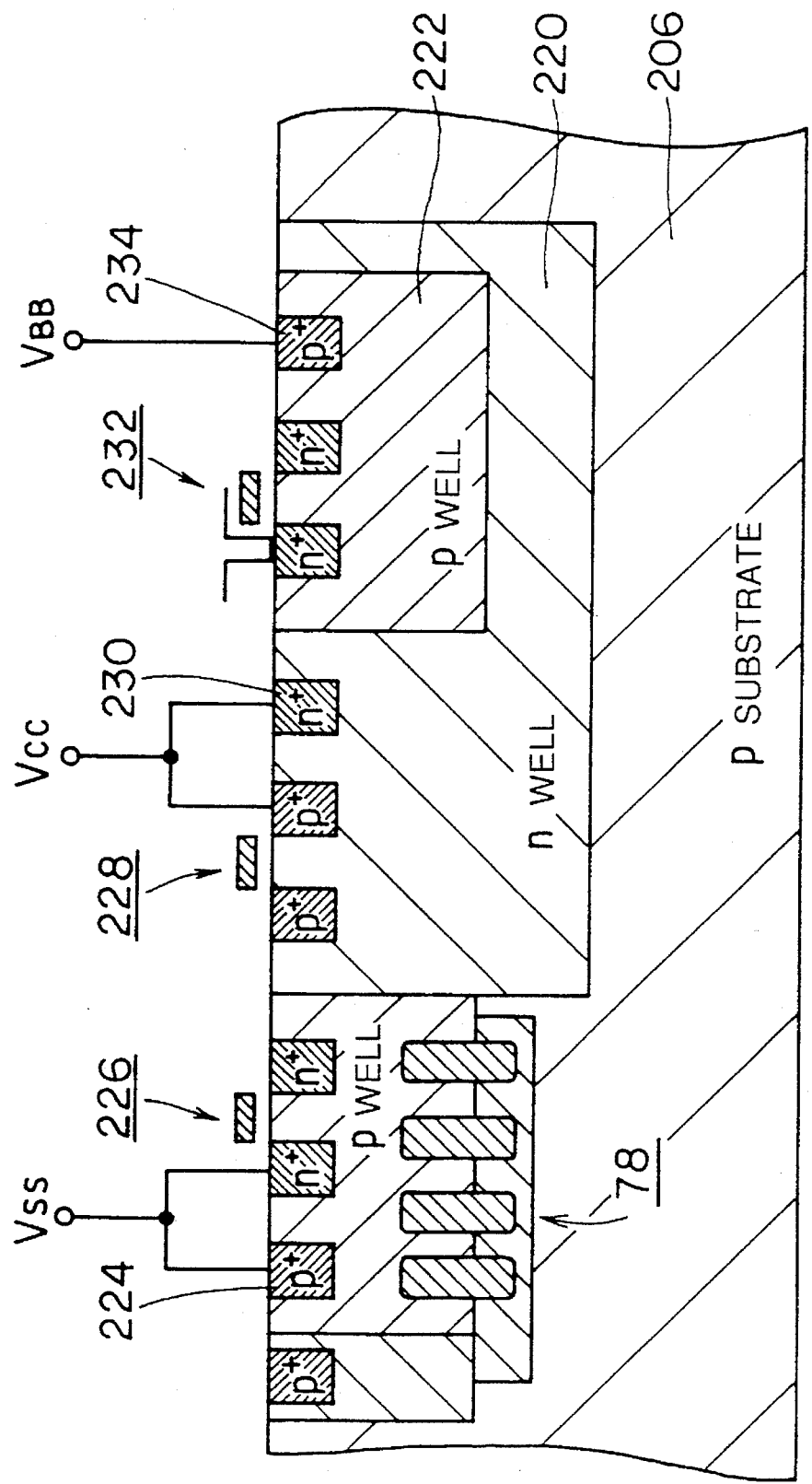
FIG. 23 is a second sectional view showing a configuration of the semiconductor device of the eleventh embodiment according to the present invention.

Referring to FIG. 23, the capacitor according to this embodiment is formed under p well 218 in peripheral circuit region 1000 of the DRAM shown in FIG. 33.

Also in this case, since the capacitor can be formed under a device such as a transistor, it is possible to form a capacitor without increasing an area.

Although description is given of the case where a p substrate is used in this embodiment, the same effect can be expected by using an n substrate.

The twelfth embodiment according to the present invention will now be described with reference to FIG. 24 and 25.

Figure 24:
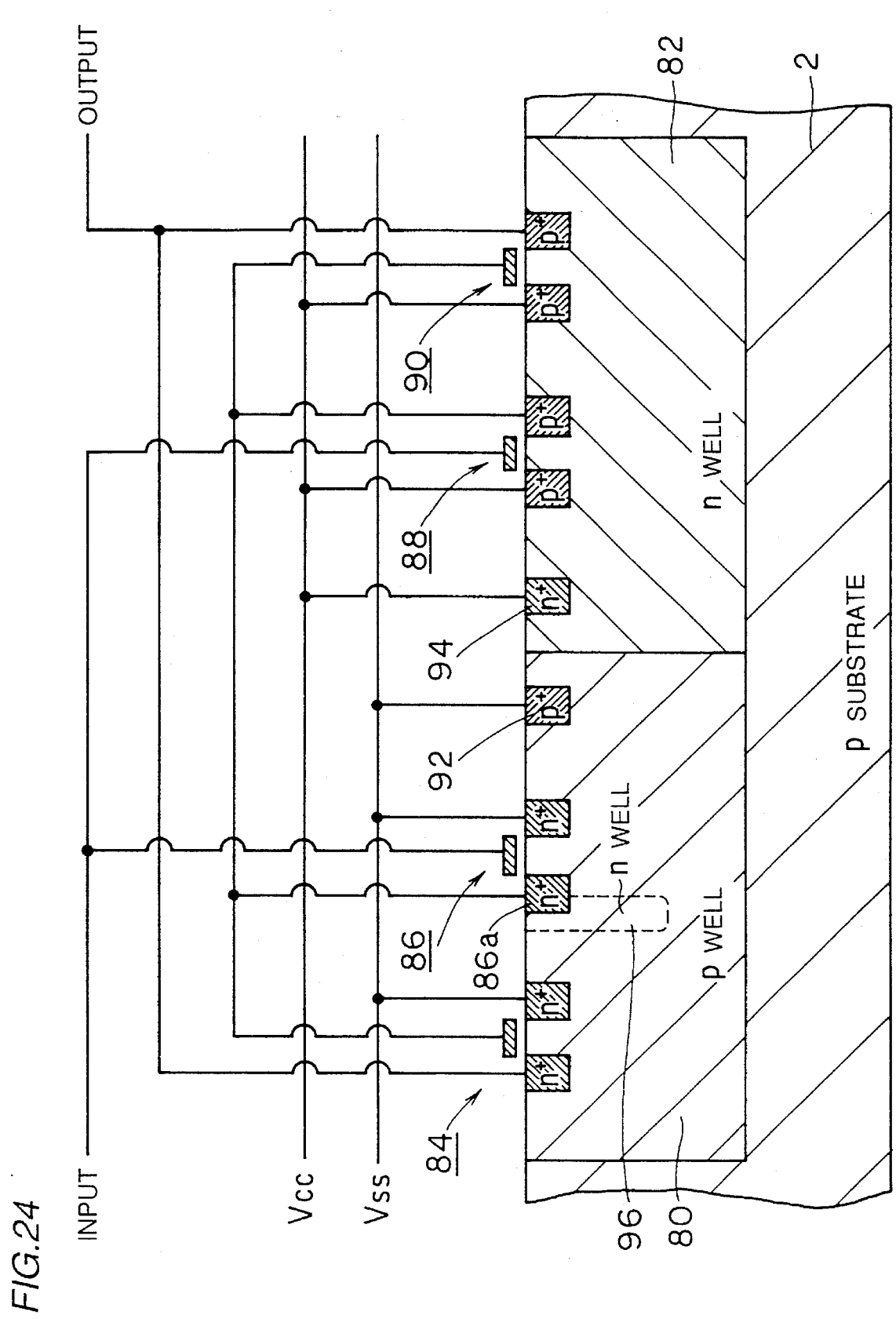
FIG. 24 is a sectional view showing a configuration of a semiconductor device of a twelfth embodiment according to the present invention.
Figure 25:
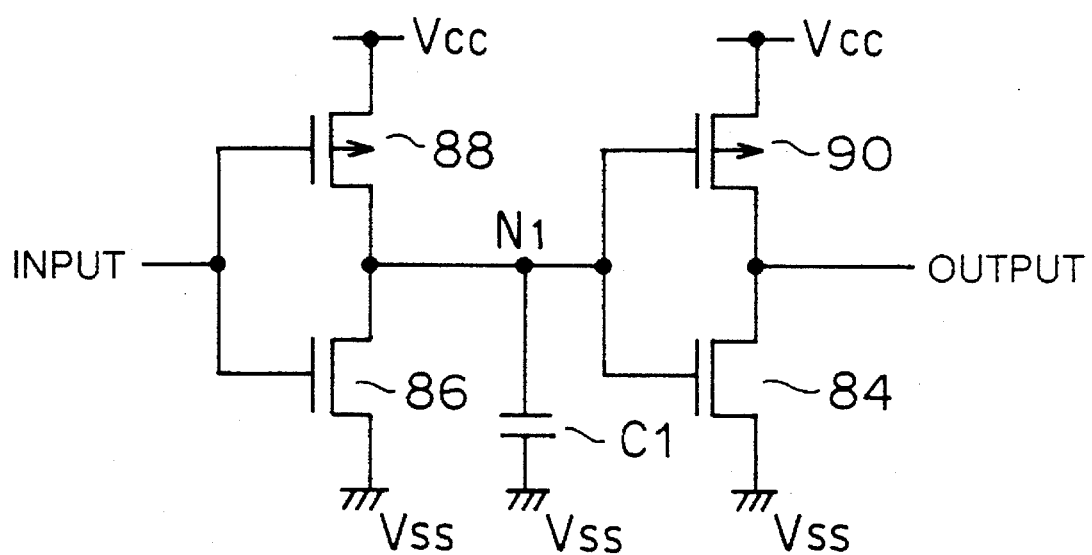
FIG. 25 is an equivalent circuit diagram of the semiconductor device of the twelfth embodiment according to the present invention.

Referring to FIG. 24, under an $n^+$ active region 86a of an n channel MOS transistor 86, for example, formed is an n well 96 of an impurity concentration lower than that of $n^+$ active region 86a in this embodiment. n well 96 is electrically connected to $n^+$ active region 86a, forming a capacitor between itself and a p well 80. The capacitor serves equivalently with a delay capacitor C1 shown in FIG. 25.

According to this embodiment, a capacitor having an optimum capacitance is formed under a particular active region. Therefore, it is possible to form a capacitor without increasing an area of the semiconductor device.

Although description is given of the case where a p substrate is used in this embodiment, the same effect can be expected by using an n substrate.

The thirteenth embodiment according to the present invention will now be described with reference to FIGS. 26 and 27.

Figure 26:
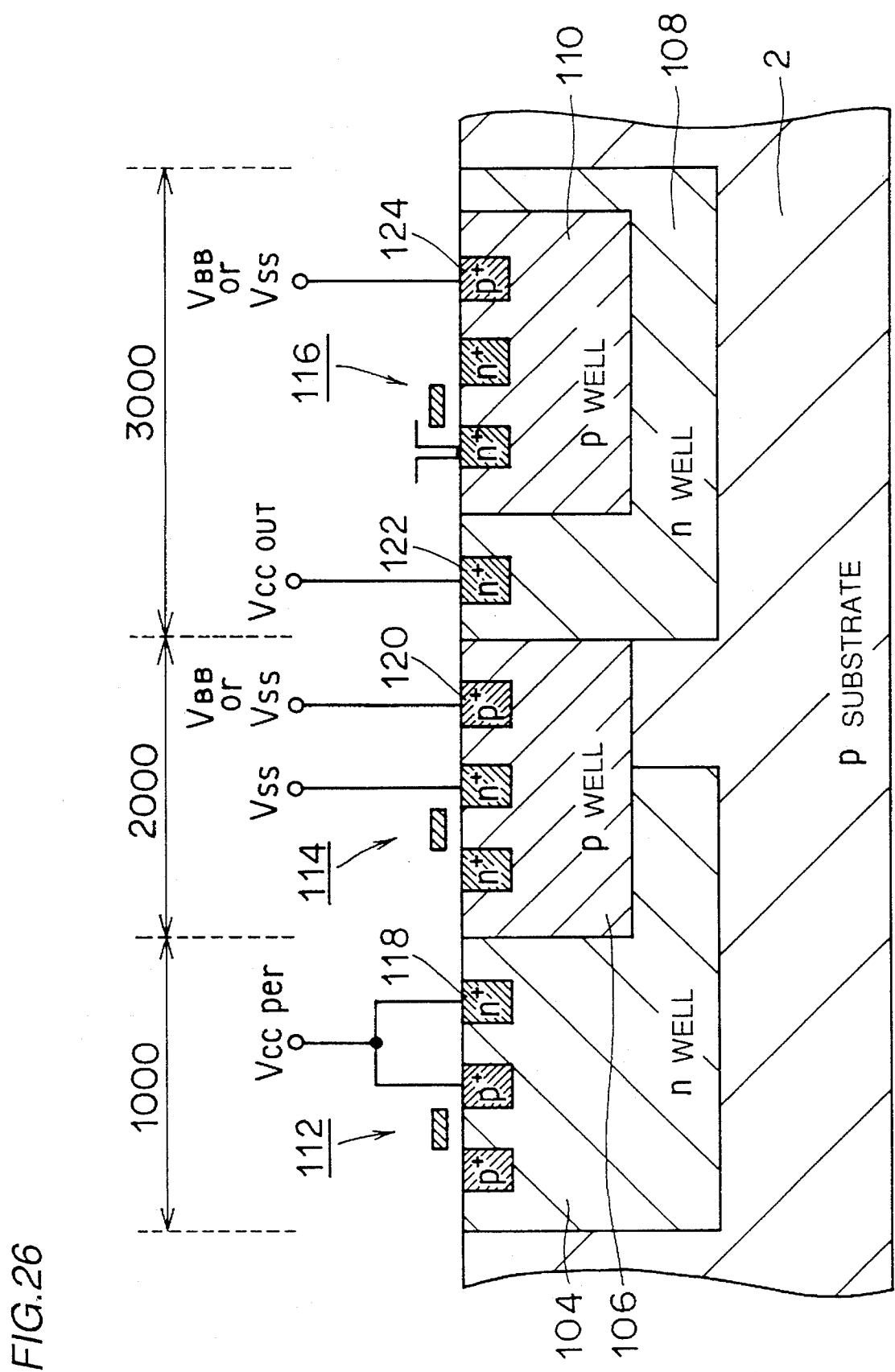
FIG. 26 is a sectional view showing a configuration of a semiconductor device of a thirteenth embodiment according to the present invention.
Figure 27:
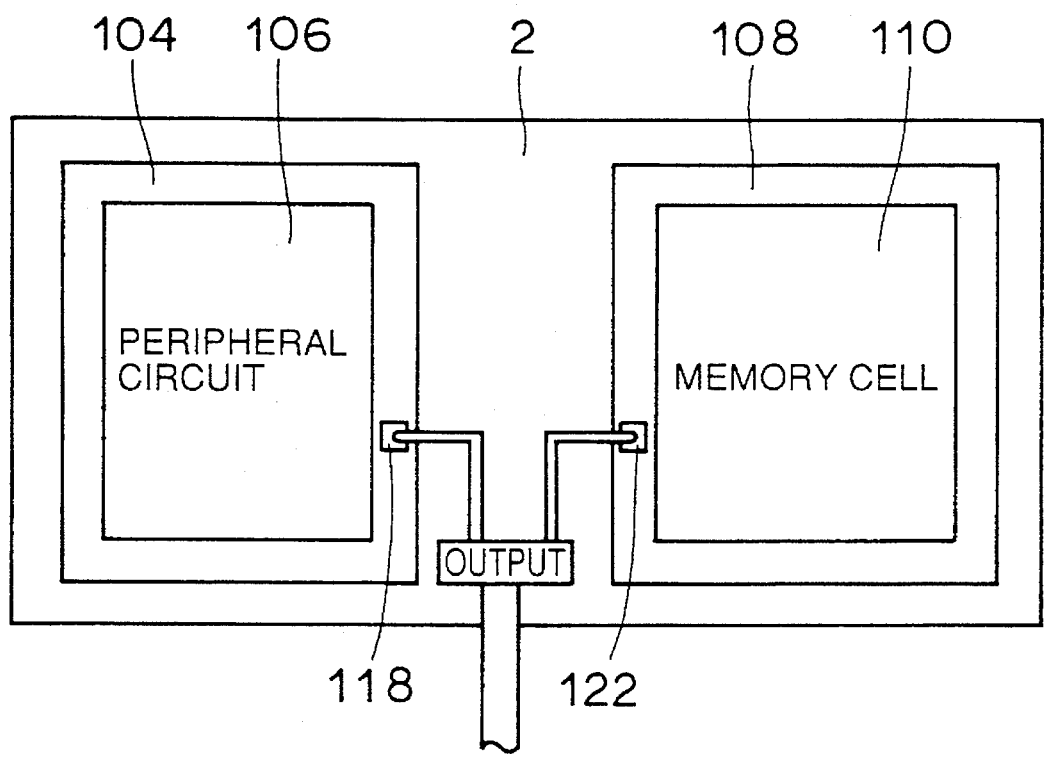
FIG. 27 is a plan view of the semiconductor device of the thirteenth embodiment according to the present invention.

Referring to FIG. 26, according to this embodiment, the external power supply voltage ($V_{CC}$) is divided into the peripheral circuit external power supply voltage ($V_{CC}$ per) and the output external power supply voltage ($V_{CC}$ out).

As described above, in an integrated circuit of a semiconductor device such as a DRAM, a decoupling capacitor or the like is used for preventing generation of noise caused by internal change of the externally supplied power supply voltage at the time of operation of an internal circuit. In a semiconductor memory device such as a DRAM, there is a case where the peripheral circuit external power supply voltage ($V_{CC}$ per) and the output external power supply voltage ($V_{CC}$ out) are input through separate pads, with reference to FIG. 27.

As the tendency of a word configuration of a memory of a semiconductor memory device to include multiple bits, the number of circuits operating simultaneously in an output portion is increased. Therefore, noise in the output portion is a large problem.

Therefore, in this embodiment, a p well 110 formed in storing circuit region 3000 is surrounded by an n well 108, and supplied with the output external power supply voltage ($V_{CC}$ out) through an $n^+$ impurity region 122.

Therefore, since a decoupling capacitor is formed under storing circuit region 3000 occupying more than half of an area of the entire semiconductor chip in this embodiment, change of the output external power supply voltage ($V_{CC}$ out) can be suppressed.

In addition, another decoupling capacitor can be formed also in peripheral circuit region 1000.

Since p well 110 is surrounded by n well 108 in this embodiment, potentials of p well 1 and p substrate 2 can be set independently.

In this embodiment, a decoupling capacitor connected to the output external power supply voltage ($V_{CC}$ out) is formed under storing circuit region 3000. However, when noise in peripheral circuit regions 1000, 2000 is a problem, the decoupling capacitor formed under storing circuit region 3000 may be connected to the peripheral circuit external power supply voltage ($V_{CC}$ per).

Although description is given of the case where a p substrate is used in this embodiment, the same effect can be expected by using an n substrate.

Figure 28:
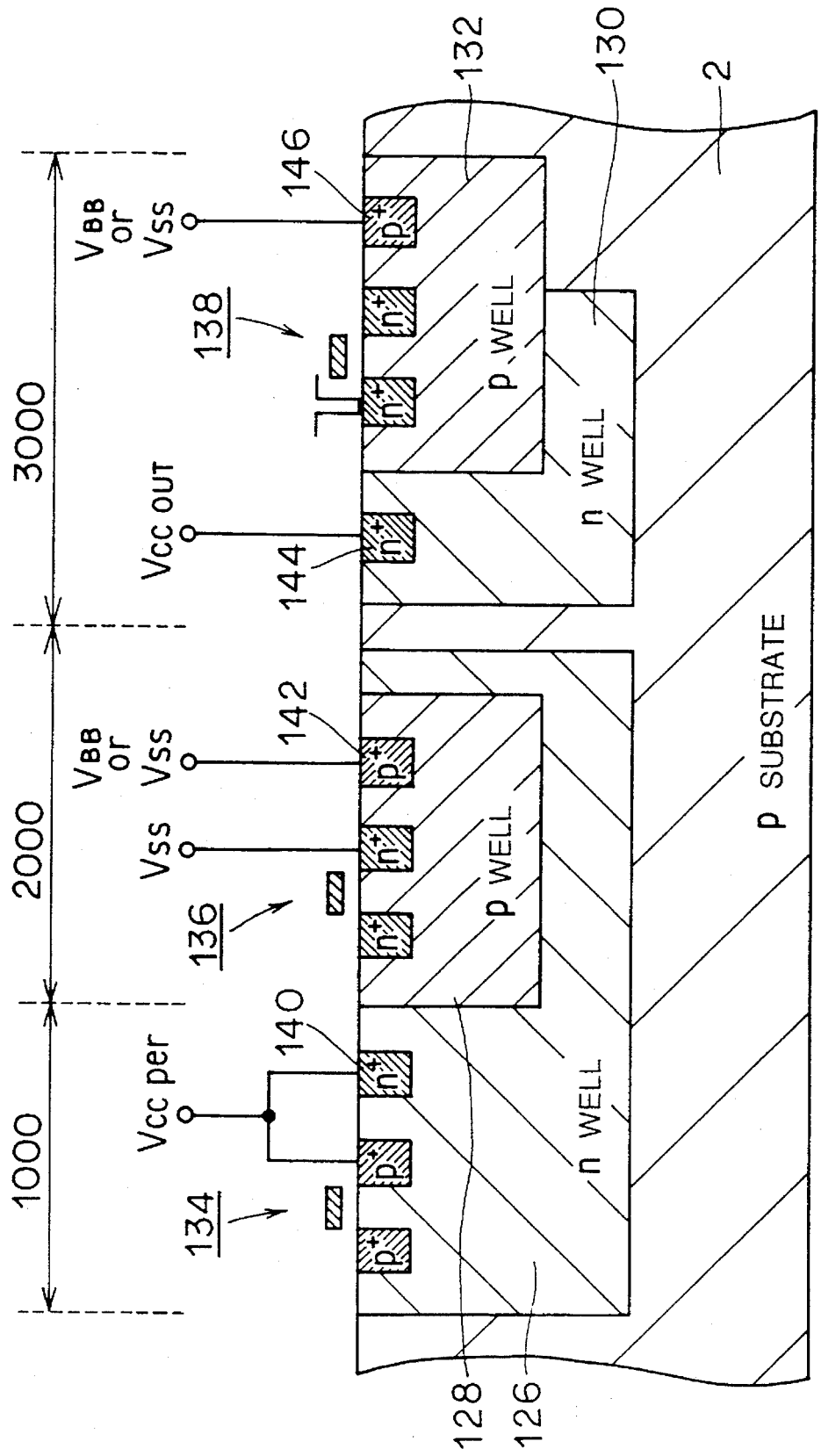
FIG. 28 is a sectional view showing a configuration of a semiconductor device of a fourteenth embodiment according to the present invention.

The fourteenth embodiment according to the present invention will now be described with reference to FIG. 28.

As compared to the thirteenth embodiment shown in FIG. 26 in which n well 108 is formed so as to surround p well 110 in storing circuit region 3000, a p well 128 in peripheral circuit region 2000 is surrounded by an n well in this embodiment.

According to such a configuration, it is possible to set the potential of p well 128 independently form those of p well 132 and p substrate 2.

Although description is given of the case where a p substrate is used in this embodiment, the same effect can be expected by using an n substrate.

The fifteenth embodiment according to the present invention will now be described with reference to FIG. 29.

In the thirteenth and the fourteenth embodiments described above, the ground potential ($V_{SS}$) is not divided into the peripheral circuit ground potential and the output circuit ground potential. However, similar to the power supply voltage, the ground potential can also be divided into the peripheral circuit ground potential and the output ground potential.

Figure 29:
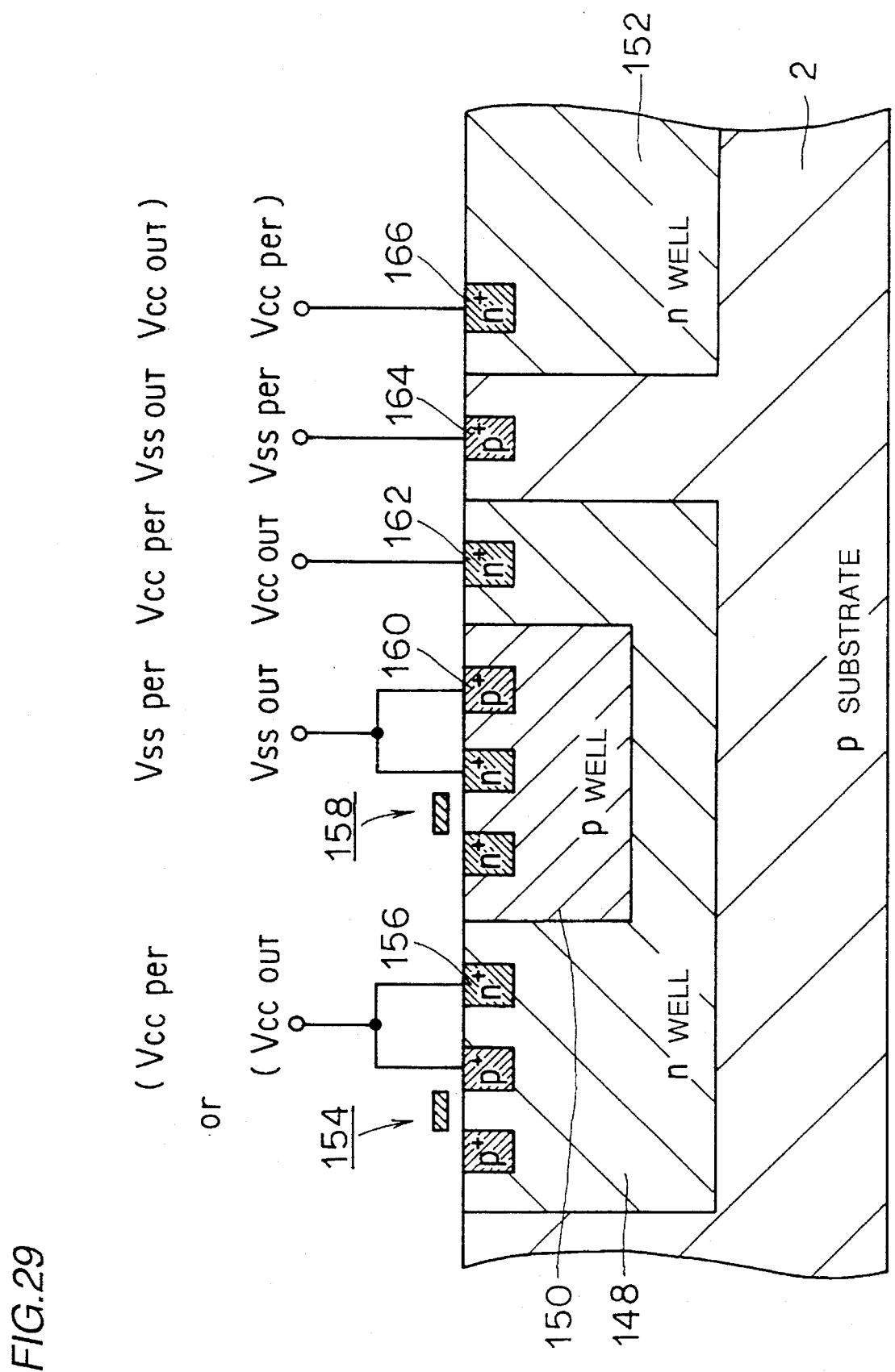
FIG. 29 is a sectional view showing a configuration of a semiconductor device of a fifteen embodiment according to the present invention.

According to the configuration shown in FIG. 29, a p well 150 is surrounded by an n well 148. Therefore, the peripheral circuit ground potential ($V_{SS}$ per) and the output ground potential ($V_{SS}$ out) can be used as independent potentials in the semiconductor device.

As a result, decoupling capacitors can be formed separately using the peripheral circuit ground potential (vss per) and the output ground potential ($V_{SS}$ out), making it possible to suppress influence of noise of each other.

Although description is given of the case where a p substrate is used in this embodiment, the same effect can be expected by using an n substrate.

The sixteenth embodiment according to the present invention will be described with reference to FIG. 30.

According to the thirteenth embodiment shown in FIG. 26, the external power supply voltage ($V_{CC}$) is divided into the peripheral circuit external power supply voltage ($V_{CC}$ per) and the output external power supply voltage ($V_{CC}$ out).

In this embodiment, an internally dropped power supply voltage ($V_{INT}$) is used as the external power supply voltage ($V_{CC}$).

In an integrated circuit of a semiconductor device, there is a case where the externally supplied power supply voltage is internally dropped, and the internally dropped power supply voltage is used as the power supply voltage by a part of the circuit, due to a problem of current consumption by operation of an internal circuit and a problem of reliability.

Since a decoupling capacitor is formed in a substrate also in this case similar to the thirteenth embodiment, a p well 174 in storing circuit region 3000 is surrounded by an n well 172, and n well 172 is supplied with the external power supply potential ($V_{CC}$) through an n+ impurity region 184.

As described above, since a decoupling capacitor is formed under a storing circuit region occupying more than half of an area of the entire semiconductor device in this embodiment, it is possible to suppress change of the external power supply voltage ($V_{CC}$).

Figure 30:
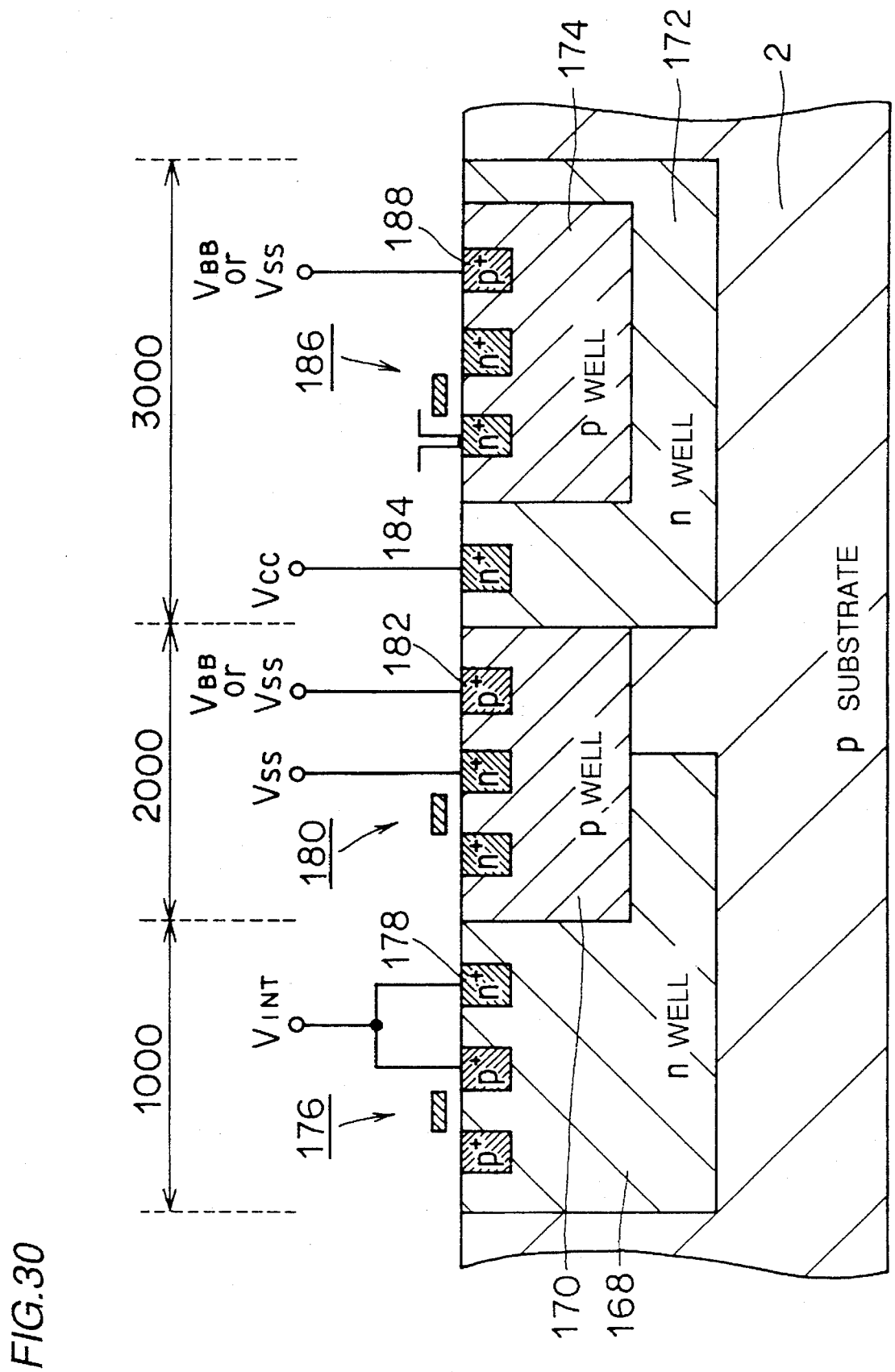
FIG. 30 is a sectional view showing a configuration of a semiconductor device of a sixteenth embodiment according to the present invention.
Figure 31:
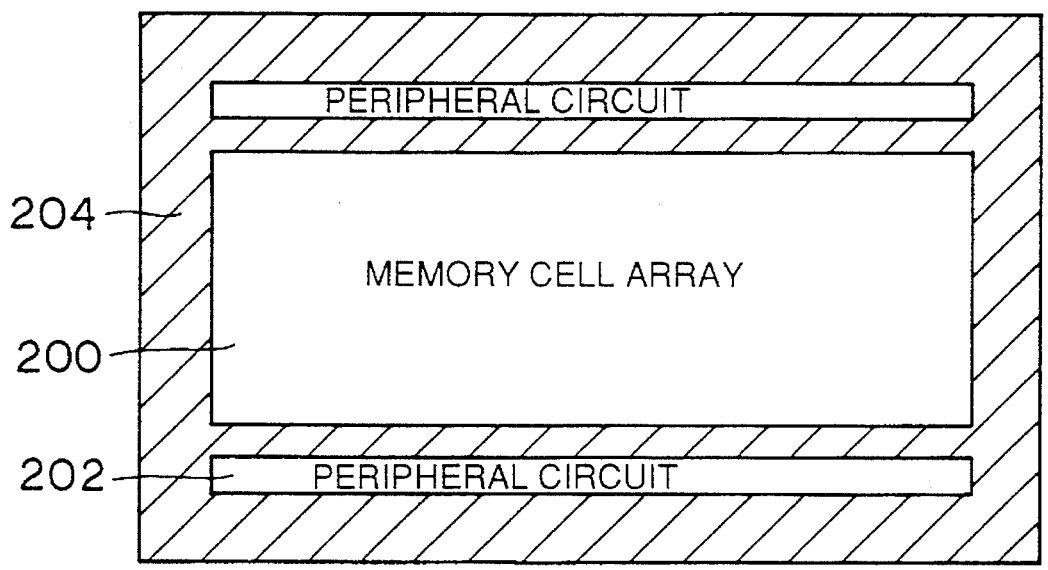
FIG. 31 is a plan view of a conventional semiconductor device.
Figure 32:
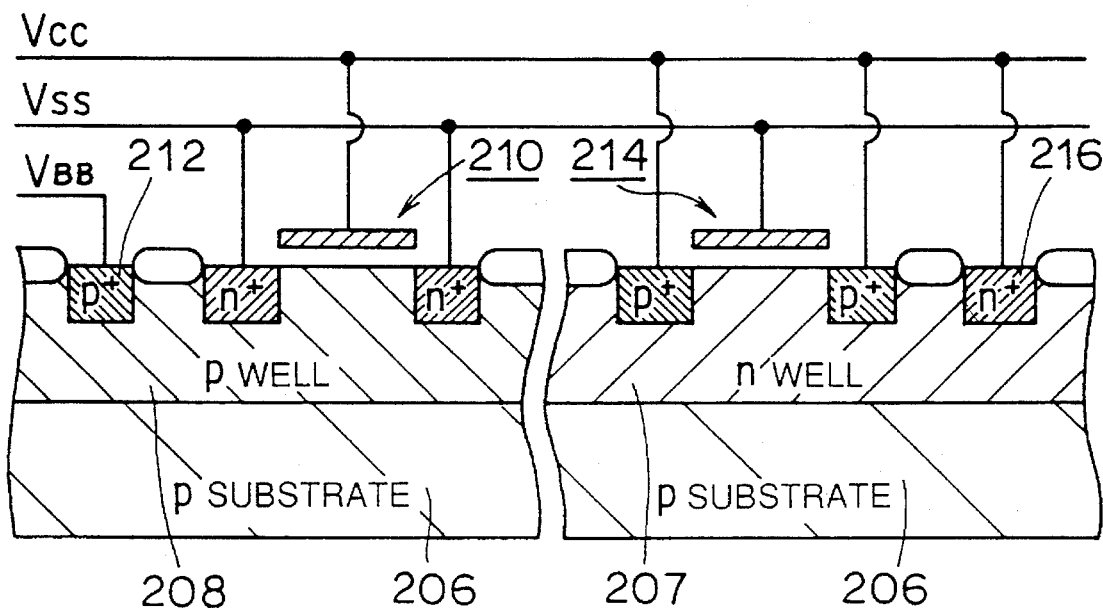
FIG. 32 is a sectional view showing a configuration of a conventional decoupling capacitor.

In addition, another decoupling capacitor can be formed using the internally dropped power supply voltage ($V_{INT}$), as shown in FIG. 30.

Since p well 174 is surrounded by n well 172 in this embodiment, the potential of p well 174 can be set independently from the potentials of p well 170 and p substrate 2.

According to this embodiment, a decoupling capacitor connected to the external power supply voltage ($V_{CC}$) is formed under a storing circuit region. However, the decoupling capacitor formed under the storing circuit region may be connected to the internally dropped power supply voltage ($V_{INT}$).

Although description is given of the case where a p substrate is used in this embodiment, the same effect can be expected by using an n substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate of a first conductivity type;

a first impurity region of a second conductivity type formed to have a predetermined depth from a main surface of said semiconductor substrate and having a first circuit region;

a second impurity region of the first conductivity type formed in said first impurity region to have a predetermined depth from the main surface of said semiconductor substrate and having a second circuit region; and a third impurity region of the first conductivity type formed in said first impurity region to have a predetermined depth from the main surface of said semiconductor substrate and having a third circuit region, wherein said semiconductor substrate and said third impurity region are set to the same potential, said second impurity region is set to a potential different from that of said semiconductor substrate and said third impurity region, and said second impurity region is set to a potential different from that of said first impurity region.

2. The semiconductor device as recited in claim 1, wherein said semiconductor substrate and said third impurity region are set to a first potential of p type, said first impurity region is set to a second potential of n type higher than said first potential, and said second impurity region is set to a third potential of p type lower than said second potential.

3. The semiconductor device as recited in claim 1, wherein said semiconductor substrate and said third impurity region are set to a first potential of n type, said first impurity region is set to a second potential of p type lower than said first potential, and said second impurity region is set to a third potential of n type higher than said second potential.

4. The semiconductor device as recited in claim 1, wherein said first circuit region and said third circuit region form a peripheral circuit, and said second circuit region form a storing circuit region.

5. A semiconductor device, comprising:

a semiconductor substrate of a first conductivity type;

a first impurity region of a second conductivity type formed to have a predetermined depth from a main surface of said semiconductor substrate and having a first circuit region;

a second impurity region of the first conductivity type formed in said first impurity region to have a predetermined depth from the main surface of said semiconductor substrate and having a second circuit region;

a third impurity region of the first conductivity type formed to have a predetermined depth from the main surface of said semiconductor substrate with a first side surface and a part of a bottom surface formed in said first impurity region and having a third circuit region; and a fourth impurity region of the second conductivity type formed to have a predetermined depth from the main surface of said semiconductor substrate so as to surround a second side surface and a part of said bottom surface of said third impurity region, wherein said semiconductor substrate and said third impurity region are set to the same potential, said first impurity region and said fourth impurity region are set to different potentials, and said second impurity region and said third impurity region are set to different potentials.

6. The semiconductor device as recited in claim 5, wherein said semiconductor substrate and said third impurity region are set to a first potential of p type, said first impurity region is set to a second potential of an type higher than said first potential, said second impurity region is set to a third potential of p type lower than said second potential, and said fourth impurity region is set to a fourth potential of n type higher than said first potential.

7. The semiconductor device as recited in claim 5, wherein said semiconductor substrate and said third impurity region are set to a first potential of n type, said first impurity region is set to a second potential of p type lower than said first potential, said second impurity region is set to a third potential of n type higher than said second potential, and said fourth impurity region is set to a fourth potential of p type lower than said first potential.

8. The semiconductor device as recited in claim 5, wherein said first circuit region and said third circuit region form a peripheral circuit, and said second circuit region form a storing circuit region.

9. A semiconductor device, comprising:

a semiconductor substrate of a first conductivity type;

a first impurity layer of a second conductivity type formed at a predetermined depth from a main surface of said semiconductor substrate;

a second impurity layer of the first conductivity type formed in contact with an upper surface of said first impurity layer;

a third impurity layer of the second conductivity type formed in contact with an upper surface of said second impurity layer and electrically connected to said first impurity layer; and a fourth impurity layer of the first conductivity type formed in contact with an upper surface of said third impurity layer and electrically connected to said second impurity layer, wherein said first impurity layer and said third impurity layer are set to a potential different from said second impurity layer and said fourth impurity layer.

10. The semiconductor device as recited in claim 9, wherein said first impurity layer and said third impurity layer are set to a ground potential, and said second impurity layer and said fourth impurity layer are set to a power supply potential.

11. The semiconductor device as recited in claim 9, comprising an impurity active region in which a semiconductor element is formed between the main surface of said semiconductor substrate and said fourth impurity layer, said impurity active region includes a fifth impurity layer of the first conductivity type electrically connected to said fourth impurity layer, and a sixth impurity layer of the second conductivity type electrically connected to said third impurity layer.

12. A semiconductor device, comprising:

a semiconductor region of a first conductivity type;

a first impurity region of the first conductivity type formed to have a predetermined depth from a main surface of said semiconductor region;

a second impurity region of a second conductivity type formed adjacent to said first impurity region; and an impurity layer of the second conductivity type formed at a predetermined depth from the main surface of said semiconductor region so as to extend within both said first impurity region and said second impurity region, wherein said first impurity region and said second impurity region are set to different potentials, and said second impurity region and said impurity layer are set to the same potentials.

13. The semiconductor device as recited in claim 12, wherein a plurality of said impurity layers are disposed at different positions in the depth direction.

14. The semiconductor device as recited in claim 12, wherein said first impurity region is set to a ground potential, and said impurity layer is set to a power supply potential.

15. The semiconductor device as recited in claim 12, wherein said first impurity region is set to a power supply potential, and said impurity layer is set to a potential lower than said power supply potential.

16. A semiconductor device, comprising:

a semiconductor region of a first conductivity type;

a first impurity region of the first conductivity type formed to have a first depth from a main surface of said semiconductor region;

a second impurity region of a second conductivity type formed adjacent to said first impurity region at a second depth greater than said first depth from the main surface of said semiconductor region; and a third impurity region of the second conductivity type formed at a depth between said first depth and said second depth to extend within both said semiconductor region and said second impurity region, wherein said semiconductor region and said third impurity region are set to different potentials.

17. The semiconductor device as recited in claim 16, wherein said semiconductor region is set to a ground potential, and said third impurity region is set to a power supply potential.

18. A semiconductor device, comprising:

a semiconductor region of a first conductivity type;

a first impurity region of the first conductivity type formed to have a predetermined depth from a main surface of said semiconductor region so as to longitudinally extend in parallel with said main surface;

a second impurity region of a second conductivity type formed adjacent to said first impurity region so as to extend in parallel with said main surface;

a third impurity region of the first conductivity type formed adjacent to said second impurity region so as to extend in parallel with said main surface; and a fourth impurity region of the second conductivity type formed adjacent to said third impurity region so as to extend in parallel with said main surface, wherein said first impurity region and said third impurity region are electrically connected at respective first end sides, said second impurity region and said fourth impurity region are electrically connected to said first impurity region and said third impurity region at a respective second sides thereof, said respective first end sides being respectively opposite said respective second sides, and said first impurity region and said third impurity region are set to a potential different from said second impurity region and said fourth impurity region, wherein, a PN junction is formed between the first impurity region and the second impurity region under a negative voltage bias.

19. The semiconductor device as recited in claim 18, wherein said first impurity region and said third impurity region are set to a ground potential, and said second impurity region and said fourth impurity region are set to a power supply potential.

20. A semiconductor device, comprising:

a semiconductor region of a first conductivity type;

a first impurity region of the first conductivity type formed to have a predetermined depth from a main surface of said semiconductor region;

a second impurity region of a second conductivity type formed extending within said semiconductor region and said first impurity region and extending longitudinally in parallel with the main surface of said semiconductor region; and a third impurity region of the second conductivity type formed adjacent to said first impurity region so as to extend longitudinally in parallel with said second impurity region, wherein said second impurity region and said third impurity region are electrically connected at respective end portions, and said first impurity region is set to a potential different from said second impurity region and said third impurity region.

21. The semiconductor device as recited in claim 20, wherein said first impurity region is set to a ground potential, and said second impurity region and said third impurity region are set to a power supply potential.

22. The semiconductor device as recited in claim 20, wherein a plurality of said second impurity regions are disposed in parallel.

23. A semiconductor device, comprising:

a semiconductor region of a first conductivity type;

a first impurity region of the first conductivity type formed to have a predetermined depth from a main surface of said semiconductor region;

a second impurity region of a second conductivity type formed adjacent to said first impurity region;

a third impurity region of the second conductivity type formed in contact with a lower surface of said first impurity region and said second impurity region; and a fourth impurity region of the second conductivity type formed so as to extend over said first impurity region and said third impurity region, wherein said first impurity region and said fourth impurity region are set to different potentials.

24. The semiconductor device as recited in claim 23, wherein said first impurity region is set to a ground potential, and said fourth impurity region is set to a power supply potential.

25. The semiconductor device as recited in claim 23, wherein a plurality of said fourth impurity regions are disposed in parallel.

26. A semiconductor device, comprising:

a source/drain region;

a capacitor;

an impurity layer of a first conductivity type having a main surface;

a first active region of a second conductivity type forming the source/drain region of a transistor and extending from the main surface to a first depth within the impurity layer; and a second active region of the second conductivity type electrically connected to the source/drain region which forms the capacitor with the impurity layer and extending from the main surface to a second depth, greater than the first depth, within the impurity layer; wherein the impurity layer and the second active region are set to different potentials.

27. A semiconductor device, comprising:

a semiconductor substrate of a first conductivity type;

a first impurity region of a second conductivity type formed to have a predetermined depth from a main surface of said semiconductor substrate;

a second impurity region of the first conductivity type formed in said first impurity region to have a predetermined depth from the main surface of said semiconductor substrate and having a second circuit region;

a third impurity region of the first conductivity type formed adjacent to said first impurity region to have a predetermined depth from the main surface of said semiconductor substrate and having a first circuit region; and a fourth impurity region of the second conductivity type formed adjacent to said third impurity region to have a predetermined depth from the main surface of said semiconductor substrate so as to surround and contact a part of a bottom surface of said third impurity region and having a third circuit region, wherein said first impurity region and said second impurity region are set to different potentials, and said third impurity region and said fourth impurity region are set to different potentials.

28. The semiconductor device as recited in claim 27, wherein said first impurity region is set to a first potential of n type, said fourth impurity region is set to a second potential of an type, said second impurity region is set to a third potential of p type lower than said first potential, and said third impurity region is set to a fourth potential of p type lower than said second potential.

29. The semiconductor device as recited in claim 27, wherein said first circuit region and said third circuit region form a peripheral circuit region, and said second circuit region form a storing circuit region.

30. A semiconductor device, comprising:

a semiconductor substrate of a first conductivity type;

a first impurity region of the first conductivity type formed to have a predetermined depth from a main surface of said semiconductor substrate and having a second circuit region;

a second impurity region of a second conductivity type formed adjacent to said first impurity region to have a predetermined depth from the main surface of said semiconductor substrate so as to surround a part of a bottom surface of said first impurity region;

a third impurity region of the second conductivity type formed to have a predetermined depth from the main surface of said semiconductor substrate and having a third circuit region; and a fourth impurity region of the first conductivity type formed in said third impurity region to have a predetermined depth from the main surface of said semiconductor substrate and having a first circuit region, wherein said first impurity region and said second impurity region are set to different potentials, and said third impurity region and said fourth impurity region are set to different potentials.

31. The semiconductor device as related in claim 30, wherein said second impurity region is set to a first potential of n type, said third impurity region is set to a second potential of n type, said first impurity region is set to a third potential of p type lower than said first potential and, said fourth impurity region is set to a fourth potential of p type lower than said second potential.

32. The semiconductor device as recited in claim 30, wherein said first circuit region and said third circuit region form a peripheral circuit region, and said second circuit region form a storing circuit region.

33. A method of manufacturing a semiconductor device, comprising the steps of:

implanting into a region at a predetermined depth from a main surface of a semiconductor substrate of a first conductivity type ions of a second conductivity type using a first resist film with a high ion energy implantation method to form a first impurity layer of the second conductivity type;

implanting ions of the first conductivity type using a second resist film with a high ion energy implantation method to form a second impurity layer of the first conductivity type on said first impurity layer so as to partially overlap said first impurity layer;

implanting ions of the second conductivity type using said first resist film with a high ion energy implantation method to form a third impurity layer of the second conductivity type on said second impurity layer; and implanting ions of the first conductivity type using said second resist film with a high ion energy implantation method to form a fourth impurity layer of the first conductivity type on said third impurity layer.

34. The semiconductor device according to claim 1, wherein the first, second and third impurity regions are each formed by a respective high ion energy implantation of a corresponding impurity.

35. The semiconductor device according to claim 16, wherein:

the first, second and third impurity regions are each formed by a respective high ion energy implantation of a corresponding impurity.

36. The semiconductor device according to claim 20, wherein:

the first, second and third impurity regions are each formed by a respective high ion energy implantation of a corresponding impurity.

37. The semiconductor device according to claim 5, wherein:

the first, second, third and fourth impurity regions are each formed by a respective high ion energy implantation of a corresponding impurity.

38. The semiconductor device according to claim 9, wherein:

the first, second, third and fourth impurity regions are each formed by a respective high ion energy implantation of a corresponding impurity.

39. The semiconductor device according to claim 18, wherein:

the first, second, third and fourth impurity regions are each formed by a respective high ion energy implantation.

40. The semiconductor device according to claim 23, wherein:

the first, second, third and fourth impurity regions are each formed by a respective high ion energy implantation of a corresponding impurity.

41. The semiconductor device according to claim 27, wherein:

the first, second, third and fourth impurity regions are each formed by a respective high ion energy implantation of a corresponding impurity.

42. The semiconductor device according to claim 30, wherein:

the first, second, third and fourth impurity regions are each formed by a respective high ion energy implantation of a corresponding impurity.

43. The semiconductor device according to claim 12, wherein:

the first impurity region, the second impurity region, and the impurity layer are each formed by a respective high ion energy implantation of a corresponding impurity.

44. The semiconductor device according to claim 26, wherein:

the second active region is formed by high ion energy implantation.

* * * * *